United States Patent
Mirkin et al.

(10) Patent No.: US 12,252,811 B2
(45) Date of Patent: Mar. 18, 2025

(54) METHOD FOR CONTROLLED GROWTH OF NANOCRYSTALS

(71) Applicant: NORTHWESTERN UNIVERSITY, Evanston, IL (US)

(72) Inventors: Chad A. Mirkin, Wilmette, IL (US); Yuanwei Li, Evanston, IL (US); Haixin Lin, Evanston, IL (US); Wenjie Zhou, Evanston, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 188 days.

(21) Appl. No.: 18/024,317

(22) PCT Filed: Sep. 8, 2021

(86) PCT No.: PCT/US2021/049443
§ 371 (c)(1),
(2) Date: Mar. 2, 2023

(87) PCT Pub. No.: WO2022/066413
PCT Pub. Date: Mar. 31, 2022

(65) Prior Publication Data
US 2023/0313412 A1    Oct. 5, 2023

Related U.S. Application Data

(60) Provisional application No. 62/706,796, filed on Sep. 10, 2020.

(51) Int. Cl.
*C30B 29/02* (2006.01)
*C30B 29/52* (2006.01)
(Continued)

(52) U.S. Cl.
CPC .............. *C30B 29/60* (2013.01); *C30B 29/02* (2013.01); *C30B 29/52* (2013.01); *B82Y 30/00* (2013.01); *B82Y 40/00* (2013.01)

(58) Field of Classification Search
CPC .......... C30B 29/60; C30B 29/02; C30B 29/52; B82Y 30/00; B82Y 40/00
See application file for complete search history.

(56) References Cited

U.S. PATENT DOCUMENTS

2016/0092372 A1* 3/2016 Radinski ............... G06F 12/121
                                                              711/133
2019/0144291 A1   5/2019 Rimer et al.

FOREIGN PATENT DOCUMENTS

WO    WO-2016/046645 A1    3/2016

OTHER PUBLICATIONS

Yong et al Control of the Morphology and Size of PbS Nanowires Using Gold Nanoparticles, Chem. Mater. 2006, 18, 5965-5972 2006.*

(Continued)

*Primary Examiner* — Robert M Kunemund
(74) *Attorney, Agent, or Firm* — MARSHALL, GERSTEIN & BORUN LLP

(57) ABSTRACT

A method of site-selective growth of a nanocrystal from an anisotropic seed can include immersing an anisotropic seed functionalized with a ligand in a growth solution having a nanocrystal precursor, a complexing agent, and a reducing agent to form a growth solution, wherein an amount of the reducing agent and/or any amount of the complexing agent is selected to define a supersaturation of the growth solution that is sufficient for overcoming an energy barrier of one or more selected regions of the functionalized seed to selectively growth the nanocrystal at the one or more selected regions.

20 Claims, 20 Drawing Sheets

(51) Int. Cl.
*C30B 29/60* (2006.01)
*B82Y 30/00* (2011.01)
*B82Y 40/00* (2011.01)

(56) References Cited

OTHER PUBLICATIONS

Zhang et al, Potential-Induced Shape Evolution of Gold Nanoparticles Prepared on ITO Substrate, J. Phys. Chem. C, vol. 113, No. 36, 2009 15796-15800.*
Duchene et al Halide Anions as Shape-Directing Agents for Obtaining High-Quality Anisotropic Gold Nanostructures dx.doi.org/10.1021/cm3020397 | Chem. Mater. 2013, 25, 1392-1399.*
Ujihara Solution-Phase Synthesis of Branched Metallic Nanoparticles for Plasmonic Applications J. Oleo Sci. 67, (6) 689-696 (2018).*
Burda et al., "Chemistry and properties of nanocrystals of different shapes", *Chem. Rev.*, 105:1025-1102 (2005).
Chen et al., Highly Crystalline Multimetallic Nanoframes With Three-Dimensional Electrocatalytic Surfaces, Science, 343:1339-1343 (2014).
Chen et al., Small Adsorbate-Assisted Shape Control of Pd and Pt Nanocrystals. Adv. Mater. 24, 862-879 (2012).
Chiu et al., Platinum nanocrystals selectively shaped using facet-specific peptide sequences. Nat. Chem. 3, 393-399 (2011).
Cortie et al., Synthesis and Optical Properties of Hybrid and Alloy Plasmonic Nanoparticles. Chem. Rev. 111, 3713-3735, (2011).
Demortière et al., In Situ Optical and Structural Studies on Photoluminescence Quenching in CdSe/CdS/Au Heterostructures. J. Am. Chem. Soc. 136, 2342-2350 (2014).
Fu et al., Interface-confined ferrous centers for catalytic oxidation. Science. 328, 1141-1144 (2010).
Gilroy et al., Bimetallic nanocrystals: Syntheses, properties, and applications. Chem. Rev. 116, 10414-10472 (2016).
Ham et al., Octahedral and Cubic Gold Nanoframes with Platinum Framework. Angew. Chemie Int. Ed. 54, 9025-9028 (2015).
Hill et al., An electrodeposited inhomogeneous metal-insulator-semiconductor junction for efficient photoelectrochemical water oxidation. Nat. Mater. 14, 1150-1155 (2015).
International Application No. PCT/US2021/049443, International Search Report and Written Opinion, mailed Mar. 2, 2022.
Janicek et al., Quantitative Imaging of Organic Ligand Density on Anisotropic Inorganic Nanocrystals. Nano Lett. 19, 6308-6314 (2019).
Jin et al., Photoinduced conversion of silver nanospheres to nanoprisms, *Science*, 294:1901-1903 (2001).
Jones et al., DNA-Nanoparticle superlattices formed from anisotropic building blocks, Nat. Mater., 9(11):913-7 (Nov. 2010).
Kim et al., Dipole-like electrostatic asymmetry of gold nanorods. Sci. Adv. 4, e1700682 (2018).
Lai et al., Morphology tuning of inorganic nanomaterials grown by precipitation through control of electrolytic dissociation and supersaturation. Nat. Chem. 11, 695-701 (2019).
Langille et al., Defining rules for the shape evolution of gold nanoparticles. J. Am. Chem. Soc. 134, 14542-14554 (2012).
Laramy et al., Controlled Symmetry Breaking in Colloidal Crystal Engineering with DNA. ACS Nano 13, 1412-1420 (2019).
Lin et al., Supersaturation-dependent surface structure evolution: From ionic, molecular to metallic micro/nanocrystals. J. Am. Chem. Soc. 135, 9311-9314 (2013).
Millstone et al., Colloidal Gold and Silver Triangular Nanoprisms. Small 5, 646-664 (2009).
Millstone et al., Iodide ions control seed-mediated growth of anisotropic gold nanoparticles, Nano Lett., 8(8):2526-9 (Aug. 2008).

O'Brien et al., Exploring the zone of anisotropy and broken symmetries in DNA-mediated nanoparticle crystallization, Proc. Natl. Acad. Sci. USA, 113(38):10485-90 (Sep. 2016).
O'Brien et al., Uniform circular disks with synthetically tailorable diameters: two-dimensional nanoparticles for plasmonics, Nano Lett., 15(2):1012-7 (Feb. 2015).
O'Brien et al., Universal noble metal nanoparticle seeds realized through iterative reductive growth and oxidative dissolution reactions, J. Am. Chem. Soc., 136(21):7603-6 (2014).
Personick et al., Shape control of gold nanoparticles by silver underpotential deposition. *Nano Lett.* 11, 3394-3398 (2011).
Personick et al., Synthesis and isolation of {110}-faceted gold bipyramids and rhombic dodecahedra. J. Am. Chem. Soc. 133, 6170-6173 (2011).
Rodriguez-Fernandez et al., Hybrid Au-SiO2 Core-Satellite Colloids as Switchable SERS Tags. Chem. Mater. 27, 2540-2545, (2015).
Rodríguez-Fernandez et al., Spatially-Directed Oxidation of Gold Nanoparticles by Au(III)?CTAB Complexes. J. Phys. Chem. B 109, 14257-14261 (2005).
Sanchez-Iglesias et al., High-Yield Seeded Growth of Monodisperse Pentatwinned Gold Nanoparticles through Thermally Induced Seed Twinning, J. Am. Chem. Soc., 139(1):107-10 (2017).
Schick et al. Multifunctional Two-Photon Active Silica-Coated Au@MnO Janus Particles for Selective Dual Functionalization and Imaging. J. Am. Chem. Soc. 136, 2473-2483, (2014).
Tsao et al., Aqueous phase synthesis of Au—Ag core-shell nanocrystals with tunable shapes and their optical and catalytic properties. J. Am. Chem. Soc. 136, 396-404 (2014).
Walker et al., Geometric curvature controls the chemical patchiness and self-assembly of nanoparticles, Nat. Nanotechnol. 8, 676-681 (2013).
Wang et al., Anisotropic Overgrowth of Metal Heterostructures Induced by a Site-Selective Silica Coating. Angew. Chemie Int. Ed. 52, 10344-10348 (2013).
Wang et al., Selectivity on Etching: Creation of High-Energy Facets on Copper Nanocrystals for CO2 Electrochemical Reduction. ACS Nano 10, 4559-4564 (2016).
Wu et al., Solution NMR Analysis of Ligand Environment in Quaternary Ammonium-Terminated Self-Assembled Monolayers on Gold Nanoparticles: The Effect of Surface Curvature and Ligand Structure. J. Am. Chem. Soc. 141, 4316-4327 (2019).
Xia et al., Shape-controlled synthesis of metal nanocrystals: Simple chemistry meets complex physics? Angew. Chemie Int. Ed. 48, 60-103 (2009).
Xiong et al., Shape-Controlled Synthesis of Metal Nanostructures: The Case of Palladium. Adv. Mater. 19, 3385-3391 (2007).
Xu et al., Dumbbell-like Au—Fe3O4 Nanoparticles for Target-Specific Platin Delivery. J. Am. Chem. Soc. 131, 4216-4217 (2009).
Ye et al., Using binary surfactant mixtures to simultaneously improve the dimensional tunability and monodispersity in the seeded growth of gold nanorods, Nano Lett., 13(2):765-71 (2013).
Young et al., Assembly of reconfigurable one-dimensional colloidal superlattices due to a synergy of fundamental nanoscale forces, Proc. Natl. Acad. Sci. USA, 109(7):2240-5 (Feb. 2012).
Yu et al., Engineering the architectural diversity of heterogeneous metallic nanocrystals. Nat. Commun. 4, 1-8 (2013).
Zeng et al., Thermodynamics and Characteristics of Heterogeneous Nucleation of Fractal Surfaces. J. Phys. Chem. C 119, 27426-27433 (2015).
Zhang et al., Concave cubic gold nanocrystals with high-index facets. J. Am. Chem. Soc. 132, 14012-14014 (2010).
Zhang et al., Photomediated synthesis of silver triangular bipyramids and prisms: The effect of pH and BSPP. J. Am. Chem. Soc. 132, 12502-12510 (2010).

* cited by examiner

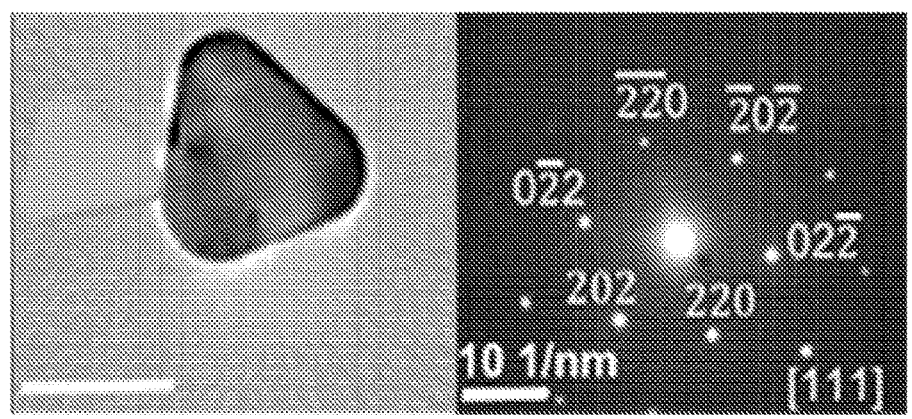
Figure 6M
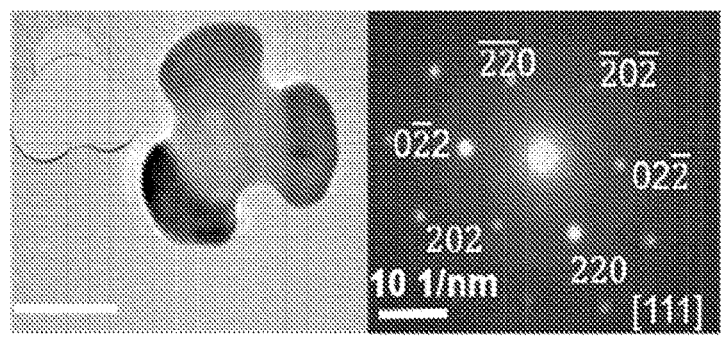
Figure 6N
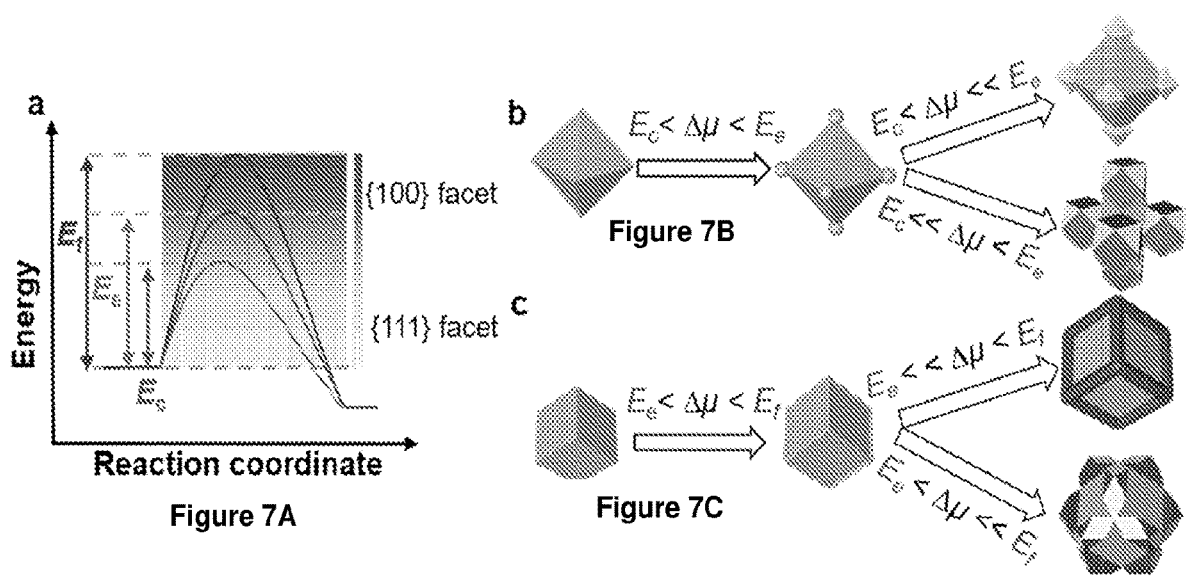
Figure 7A
Figure 7B
Figure 7C Seeds NCs  Low $C_{AA}$  High $C_{AA}$ 100 mM $C_{CTAB}$ 10 mM $C_{CTAB}$ Less Seed →

100 mM $C_{CTAB}$

Less Seed →

10 mM $C_{CTAB}$

METHOD FOR CONTROLLED GROWTH OF NANOCRYSTALS

STATEMENT OF GOVERNMENT SUPPORT

This invention was made with government support under DE-SC0000989 awarded by the Department of Energy, and FA9550-17-0348 awarded by the Air Force Office of Scientific Research.

BACKGROUND

Field of the Disclosure

The disclosure relates to methods of site selective growth of a nanocrystal from a ligand functionalized seed, and more particularly, to the site-selective growth of a nanocrystal from a ligand functionalized seed through turning of a relationship between an energy barrier of the site to be grown and a supersaturation of the growth solution.

BRIEF DESCRIPTION OF RELATED TECHNOLOGY

The ability to precisely control nanocrystal (NC) shape and composition is useful in many fields, including catalysis and plasmonics. Seed-mediated strategies have proven effective for preparing a wide variety of structures, but a poor understanding of how to selectively grow corners, edges, and facets has limited the development of a general strategy to control structure evolution. Nanocrystal shape and composition are important parameters that influence the properties of such structures and, therefore, their uses in many fields, including catalysis, plasmonics, therapeutics, and biological imaging. Accordingly, a variety of methods have been developed that allow one to control these parameters, albeit in selected cases. The most prevalent methodologies involve seed-mediated syntheses. For example, capping agents have been used to selectively cap different faces of spherical seeds to promote anisotropic growth and the formation of nanocubes, octahedra, rhombic dodecahedra, and nanocrystals of other shapes. Spherical gold and silver nanocrystals have been used as plasmonic seeds, where light of a specific wavelength was used to guide the growth of triangular prisms with wavelength control over prism edge length. In addition, other potential deposition techniques have been used with gold and palladium seeds to prepare a wide variety of nanocrystal geometries, including rhombic dodecahedra, bipyramids, truncated ditetragonal prisms, and concave cubes.

While most studies have focused on spherical seeds, some anisotropic seeds have been utilized to prepare a variety of structures. For example, rod-shaped seeds have been used to generate elongated rhombic dodecahedral gold nanocrystals. Moreover, rhombic dodecahedral gold seeds have been used as cores for the synthesis of Au—Ag core-shell nanocrystals with cubic, cuboctahedral, and octahedral structures. Anisotropic seeds combined with masking or galvanic replacement have been used to prepare heterogeneous metallic or hollow nanostructures.

However, with most traditional seed-mediated approaches, the spherical or anisotropic seeds act as nuclei due to the absence of significant energy barriers for subsequent growth. Consequently, secondary nucleation does not occur and instead growth occurs at all positions on the seeds.

SUMMARY

There remains a need for a versatile strategy that allows controlled growth on seeds in site-specific manners. Disclosed herein is a universal synthetic strategy for directing site-specific growth of anisotropic seeds to prepare a library of nanostructures, where many architectural elements can be programmed deliberately and independently using three fundamental design rules. The methods of the disclosure can advantageously take advantage of nucleation energy barrier profiles, dictated by seed curvature/facet differences, and the chemical potential of the growth solution to control the site-specific growth of the nanocrystals into desired shapes and compositions. The methods of the disclosure can be used to not only control growth sites on anisotropic seeds, but also control the exposed facets of newly grown regions.

BRIEF DESCRIPTION OF THE DRAWINGS

FIG. 6M is a TEM image and corresponding SAED pattern of a nanoprism. The diffraction pattern is characteristic of the [111] orientation. Scale bar: 100 nm;

FIG. 6N is a TEM image and corresponding SAED pattern of a AU nanodisk after concave-type facet-selective growth. The diffraction pattern is characteristic of the [111] orientation. Scale bar: 100 nm;

FIG. 7A is a graph showing the E profile of nanocrystals. Different facets are favored based on the differences in facet surface energies—{100} facets (upper line) have higher energy than {111} facets (lower line);

FIG. 7B is a schematic of nanocrystals grown using corner-nucleated octahedra as seed, showing that facets of the nanocrystals grown on existing nuclei on the corners of octahedra can be tuned through fin control of $\Delta\mu$;

FIG. 7C is a schematic of nanocrystals grown using edge-nucleated nanocubes as seed, showing that facets of the nanocrystals grown on existing nuclei along the edges of the nanocubes can be tuned through fin control of $\Delta\mu$;

FIG. 14C is an SEM image of octahedra growth while adding gold precursors four separately and successively, showing growth only occurred on the existing nuclei at corners, resulting in enhanced selectivity. Scale bars, 100 nm;

DETAILED DESCRIPTION

Figure 1A:
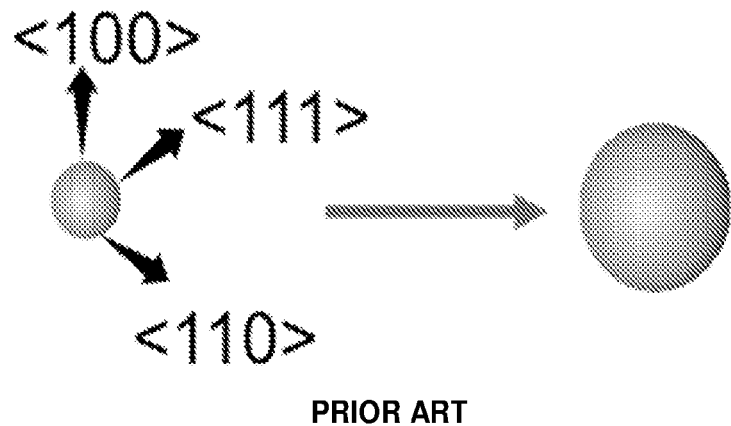
FIG. 1A is a schematic illustration of a conventional method of growing nanocrystals.

Disclosed herein are methods of site-selective growth of nanocrystals from anisotropic seeds. In accordance with embodiments, the method can include functionalizing an anisotropic seed with a ligand, wherein the anisotropic seed has at least two regions that have different curvatures and/or facets in different crystallographic planes, the ligand attaches to the seed in the at least two regions, thereby resulting in a functionalized seed having at least two different energy barriers for subsequent growth defined at the at least two regions; selecting at least one of the at least two regions for site-selective growth, wherein the at least one selected region has a selected region energy barrier; admixing a nanocrystal precursor, a complexing agent, and a reducing agent to form a growth solution, wherein an amount of the reducing agent and/or any amount of the complexing agent is selected to define a supersaturation of the growth solution that is sufficient for overcoming the selected region energy barrier; and immersing the functionalized seed in the growth solution under conditions for site-selectively growth of the nanocrystal at the at least one selected region.

In embodiments, a multi-step method can be used in which nucleation and growth are separated into different steps of the process. For example, a multi-step process can include functionalizing the anisotropic seed with a ligand, wherein the anisotropic seed has at least two regions having different curvatures, the ligand attaches to the anisotropic seed in the at least two regions, thereby resulting in a functionalized seed having at least two different energy barriers for subsequent growth at the at least two regions. The method further includes selecting one of the at least two regions for site-selective growth, wherein the selected region has a selected region energy barrier. The functionalized seed is then in a growth solution under conditions to selectively form nuclei at the selected region of curvature to thereby form a selected curvature-nucleated seed, wherein the first growth solution comprises a nanocrystal precursor, a complexing agent, and a reducing agent, and an amount of the reducing agent and/or an amount of the complexing agent is selected to define a supersaturation of the first growth solution that is sufficient for overcoming the selected region energy barrier. To then grow nanocrystals at the nuclei, nanocrystal is added to the growth solution.

In embodiments, a multi-step process can be used to control the energy of the exposed facets of the newly formed nanocrystals with site-selective growth at a corner or edge region. For example, with corner-nucleated growth, the process can include functionalizing the anisotropic seed with a ligand, wherein the anisotropic seed has at least a corner region and an edge region, the ligand attaches to the anisotropic seed in at least the corner region and the edge region, thereby resulting in a functionalized seed having corner energy barrier and an edge energy barrier, wherein the edge energy barrier is greater than the corner energy barrier. The functionalized seed is then immersed in a first growth solution under conditions to selectively form nuclei at the corner region to thereby form a corner-nucleated seed. The first growth solution comprises a nanocrystal precursor, a complexing agent, and a reducing agent, and an amount of the reducing agent and/or an amount of the complexing agent is selected to define a supersaturation of the first growth solution that is sufficient to overcome the corner energy barrier but not the edge energy barrier. The corner-nucleated seed is then immersed in a second growth solution under conditions to selectively grow the nanocrystals at the nuclei. The second growth solution comprises a nanocrystal precursor, a complexing agent, and a reducing agent, and an amount of the reducing agent and/or an amount of the complexing agent is selected to define a supersaturation of the second growth solution that is sufficient to overcome the corner energy barrier but not the edge energy barrier. The supersaturation of the second growth solution can be tuned to selectively form nanocrystals with either high or low energy facets as the exposed facets of the newly formed nanocrystals. For example, when the supersaturation of the second growth solution is greater than the supersaturation of the first growth solution, such that $E_c \ll \Delta\mu < E_e$, nanocrystals grow at the nuclei having high energy facets as exposed facets. When the supersaturation of the second growth solution is less than the supersaturation of the first growth solution, such that $E_c<\Delta\mu<<E_e$, nanocrystals grow at the nuclei having low energy facets as exposed facets.

For example, for edge-nucleated growth, a multi-step process can include functionalizing the anisotropic seed with a ligand, wherein the anisotropic seed has at least a corner region, an edge region, and a facet region, the ligand attaches to the anisotropic seed in at least the corner region, the edge region, and the facet region, thereby resulting in a functionalized seed having corner energy barrier, an edge energy barrier, and a facet energy barrier, wherein the facet energy barrier is greater than the edge energy barrier, and the edge energy barrier is greater than the corner energy barrier. The functionalized seed is then immersed in a first growth solution under conditions to selectively form nuclei at the edge region to thereby form an edge-nucleated seed. The first growth solution comprises a nanocrystal precursor, a complexing agent, and a reducing agent, and an amount of the reducing agent and/or an amount of the complexing agent is selected to define a supersaturation of the first growth solution that is sufficient to overcome the edge energy barrier but not the facet energy barrier. The edge-nucleated seed is then immersed in a second growth solution under conditions to selectively grow the nanocrystals at the nuclei. The second growth solution comprises a nanocrystal precursor, a complexing agent, and a reducing agent, and an amount of the reducing agent and/or an amount of the complexing agent is selected to define a supersaturation of the second growth solution that is sufficient to overcome the edge energy barrier but not the facet energy barrier. The supersaturation of the second growth solution can be tuned to control the exposed facets of the newly grown nanocrystals. For example, when the supersaturation of the second growth solution is greater than the supersaturation of the first growth solution, such that $E_e<<\Delta\mu<E_f$, nanocrystals grow at the nuclei having high energy facets as exposed facets. For example, when the supersaturation of the second growth solution is less than the supersaturation of the first growth solution, such that $E_e<<\Delta\mu<E_f$, nanocrystals grow at the nuclei having low energy facets as exposed facets.

The anisotropic seed can have any suitable shape. For example, the anisotropic seed can be a rod, disk, cube, octahedron, concave rhombic dodecahedron, triangular prism, or any other polyhedral shapes. Anisotropic seeds can be formed by any known method in the art. Anisotropic seeds can be made of various materials including, but not limited to, gold, $Fe_3O_4$, Ag, and quantum dots.

Figure 1B:
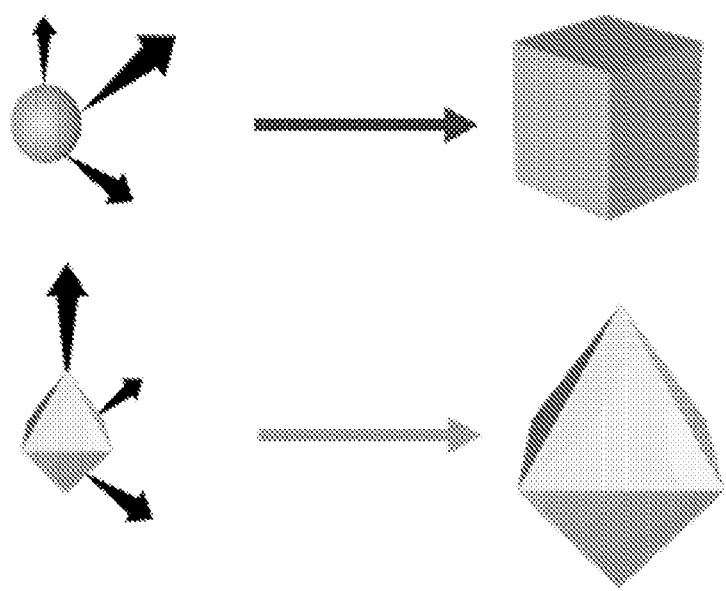
FIG. 1B is a schematic illustration of another conventional method of growing nanocrystals.
Figure 2:
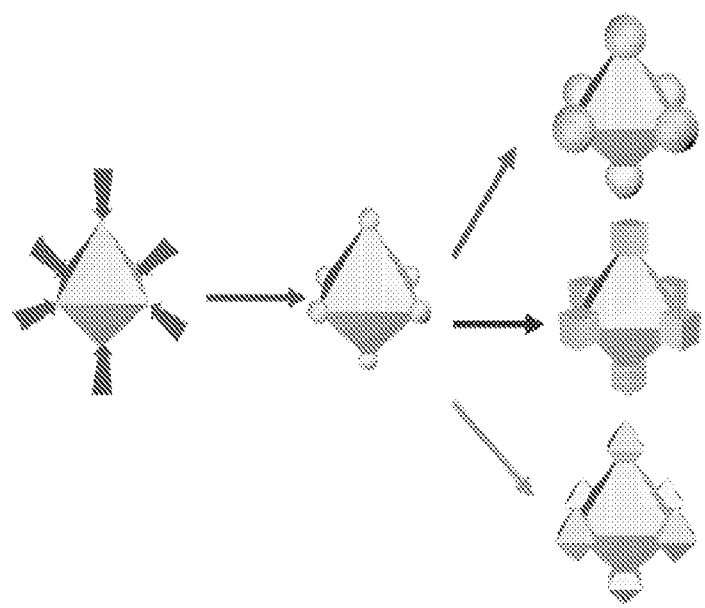
FIG. 2 is a schematic illustration of growth of nanocrystals in accordance with embodiments of the disclosure.

Referring to FIGS. 1A and 1B, conventional nanocrystal growth methods do not include secondary nucleation and therefore cannot offer site-selective growth as provided for in the methods of the disclosure. Rather, the spherical or anisotropic seeds act as nuclei due to the absence of significant energy barriers for subsequent growth and growth proceeds at all positions on the seeds. In the conventional methods shown in FIG. 1A, isotropic nanocrystals are grown using an isotropic seed and growth with the same rate along all directions and all locations of the seed. This results in isotropic, spherical nanocrystals. In the conventional methods shown in FIG. 1B, anisotropic nanocrystals are grown using an anisotropic or isotropic seed. While growth is accomplished at different rates along different directions, growth still proceeds at all locations of the seeds. This results in anisotropic shapes such as octahedra, cubes, and the like.

In contrast to conventional methods, methods of the disclosure advantageously utilize secondary nucleation at specific sites of the seeds to control growth only at the new nuclei on the seeds and obtain site-specific nucleation and growth. Methods of the disclosure utilize distinct energy barriers introduced at different sites on an anisotropic seed. In embodiments, ligands are applied to the seeds to introduce energy barrier differences on the anisotropic seeds, thereby allowing access to corner, edge or facet-selective deposition while tuning the supersaturation ($\Delta\mu$) of the growth solution (the driving force) to only surmount certain energy barriers. This can allow for growth of nanocrystals having never reported shapes. For example, nanocrystals grown using the method of the disclosure include corner/edge-specifically grown concave rhombic dodecahedral, corner-specifically grown decahedral, {110} facet—specifically grown rod-shaped, concave facet—specifically grown disk-shaped nanocrystals. Various other shapes are also contemplated herein with the methods of the disclosure.

Figure 3A:
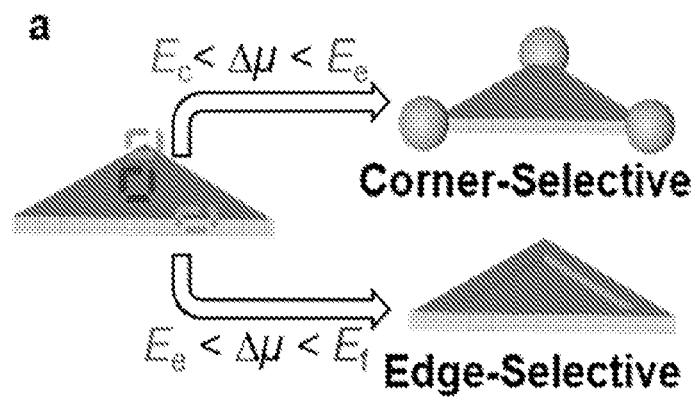
FIG. 3A is a schematic illustration of the chemical potential difference ($\Delta\mu$) for nanocrystal growth showing it can be tuned to favor corner- and edge-selective growth using a method in accordance with the disclosure.
Figure 3B:
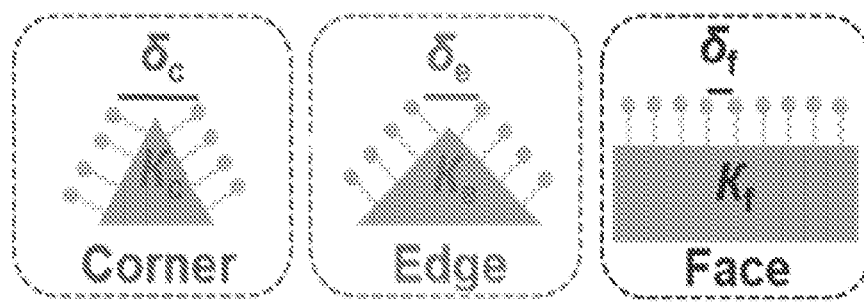
FIG. 3B is a schematic illustration of different regions (corner (c), edge (e), and face (f)) of a nanoprism with varying curvatures, and therefore different ligand distributions. The higher the curvature (K), the larger the average distance between the ligands ($\delta$) (here, $K_c > K_e > K_f$ such that $\delta_c > \delta_e > \delta_f$)
Figure 3C:
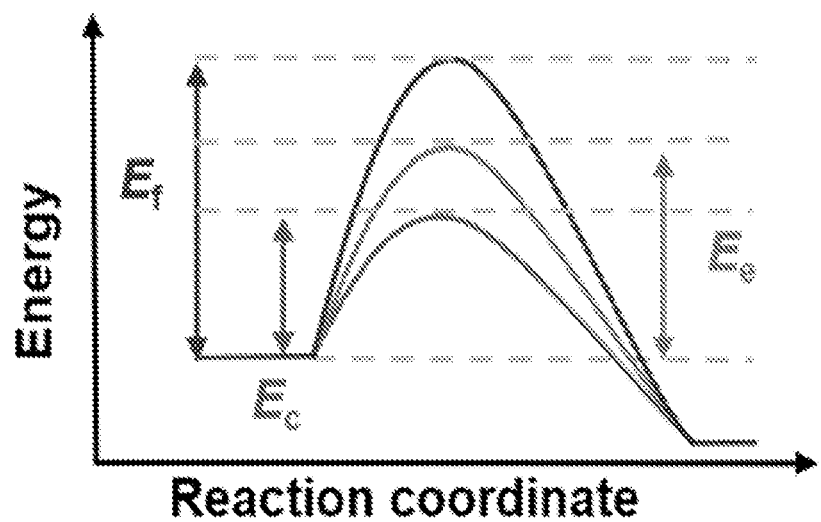
FIG. 3C is a schematic illustration of the energy barrier (E) profile for nanocrystal growth, which is dictated by the degree of curvature, to illustrate the relationship $E_c < E_e < E_f$.
Figure 3D:
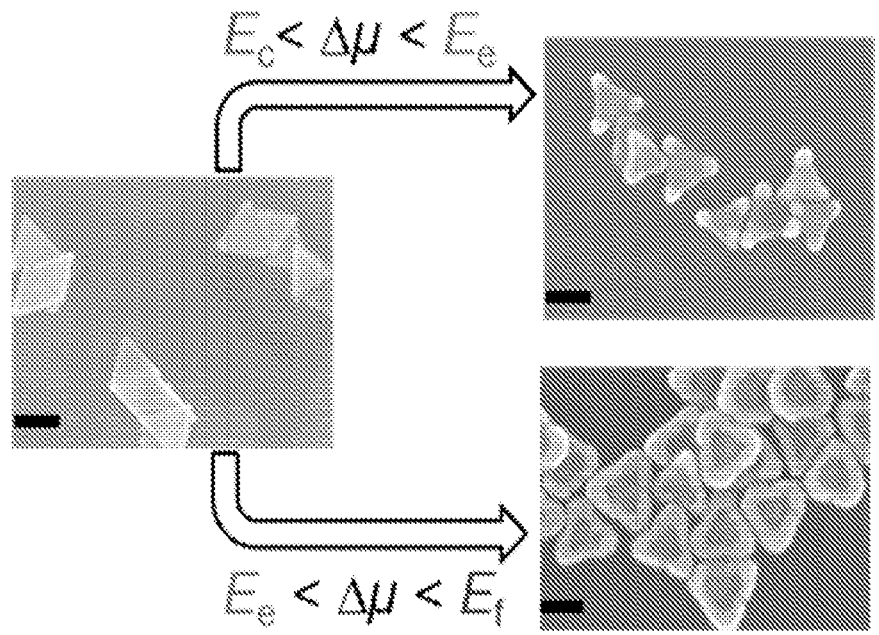
FIG. 3D is scanning electron microscopy (SEM) images showing corner- and edge-selective nucleation on nanoprisms. Scale bars, 100 nm.

It has been observed that ligands tethered onto regions of different curvature on an anisotropic nanocrystal experience different degrees of confinement, which ultimately translates into varying magnitudes of energy barriers Eat different sites. Referring to FIGS. 3A-3C, when the curvature (K) at a site is higher, the average distance between ligands ($\delta$) is larger, which provides easier access to solutes for subsequent deposition and results in lower energy barriers for that site. For example, triangular gold nanoprisms have different curvatures at corners, edges, and faces. Sites with larger curvature grow at smaller supersaturation $\Delta\mu$. The curvature of the corner $K_c$ is larger than the curvature of the edge $K_e$, which in turn is larger than the curvature of the face $K_f$, so $K_c>K_e>K_f$. Correspondingly the average distance between ligands for this triangular gold nanoprism is greatest at the corners, and greater at the edge than the face, so $\delta_c>\delta_e>\delta_f$. This in turn results in the energy barrier being the lowest at the corners and the greatest at the face, so $E_c<E_e<E_f$. Based on these differences at the various regions of the nanoprism, the supersaturation $\Delta\mu$ of the growth solution can be adjusted and specific curvature-selective energy window can be attained, enabling corner- and edge-selective nucleation.

Figure 17:
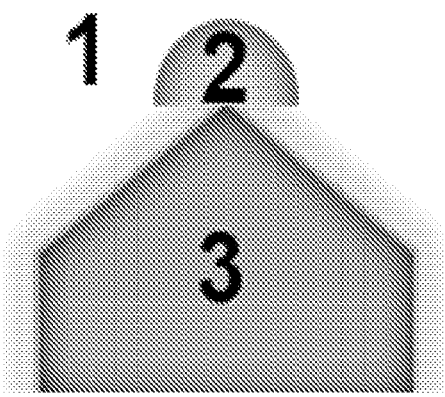
FIG. 17 is a schematic illustration of a seed nanocrystal having 2: nucleus; 1: parent phase. Gray layer around 3: ligands on the seed.

According to classic nucleation theory, the change in the free energy, $\Delta G$, accompanying the nucleation, can be expressed by:

$$\Delta G = V_2 \Delta g + A_{12}\sigma_{12} + A_{23}(\sigma_{23}-\sigma_{13}) \tag{1}$$

where the subscripts 1, 2, and 3 in this equation refer to the parent phase, nucleation embryo or germ, and seed, respectively (FIG. 17). $\Delta g$ is the free energy change per unit volume of the embryo from phase 1 to phase 2, $V_2$ is the volume of the embryo, $\sigma_{ij}$ is the interfacial energy between phases i and j, and $A_{ij}$ is the corresponding interfacial area. This equation indicates that the free energy change of heterogeneous nucleation, $\Delta G$, is composed of the (volumetric) energy change of the bulk phase transition, $\Delta g V_2$, and the possible energy change as surfaces are created, $\sigma_{12}A_{12}$, eliminated, $-\sigma_{13}A_{23}$, and replaced by the new interface, $\sigma_{23}A_{23}$.

Assuming the nucleus is hemispherical, $$\Delta G = \frac{2}{3}\pi r^3 \Delta g + 2\pi r^2 \sigma_{12} + \pi r^2(\sigma_{23}-\sigma_{13}).$$

When $$\frac{d\Delta G}{dr} = 0,$$

the critical radius $$r^* = \frac{\sigma_{13} - \sigma_{23} - 2\sigma_{12}}{\Delta g}.$$

So the nucleation energy barrier $$E = \Delta G^* = \frac{\pi(2\sigma_{12} + \sigma_{23} - \sigma_{13})^3}{3(\Delta g)^2}.$$

In the methods of the disclosure, with anisotropic seeds functionalized with a ligand, for example, mPEG6 disulfide, $\sigma_{13}$ is influenced by both the curvature-dependent ligand distribution and the facet-dependent energy, thus changing the corresponding E for subsequent nanocrystal nucleation. On the one hand, when the curvature (K) at a site of the seed is higher, the average distance between the ligands ($\delta$) is larger, resulting in larger $\sigma_{13}$ and therefore a lower E for the following nucleation. On the other hand, the higher surface energy facet, due to lower coordination number, results in higher $\sigma_{13}$, thus leading to lower E. Therefore, both higher curvature with less dense ligands and the facet with higher surface energy can decrease the corresponding E for subsequent nucleation.

To achieve selective growth, the energy barriers at the different curvatures—for example, the corner, edge, and face, must be well separated in magnitude. The length and binding affinity of the ligand can also affect the profiles and growth selectivity. As demonstrated in the examples below, ligands that only bind weakly will negligibly affect the energy barrier values and are not suitable for selective and directive growth, and instead results in uniform growth. One such weakly binding ligand is CTAB. It was further found that when a relatively long ligand with a higher binding affinity is used, such as mPEG5k thiol, the energy barrier exceeds the homogenous nucleation energy barrier and growth is not observed on the nanoprism. Suitable ligands have sufficient affinity to affect the energy barrier profiles, but result in energy barriers that are below that of homogenous nucleation. It was found that mPEG6 disulfide as a ligand can all for the generation of energy barrier profiles that are well separated in magnitude to allow the $\Delta\mu$-E relationship to be tuned to achieve selective nucleation. For example, for corner-selective nucleation $E_c<\Delta\mu<E_e$, and for edge-selective nucleation $E_e<\Delta\mu<E_f$.

Figures 4A, 4B, 4C:
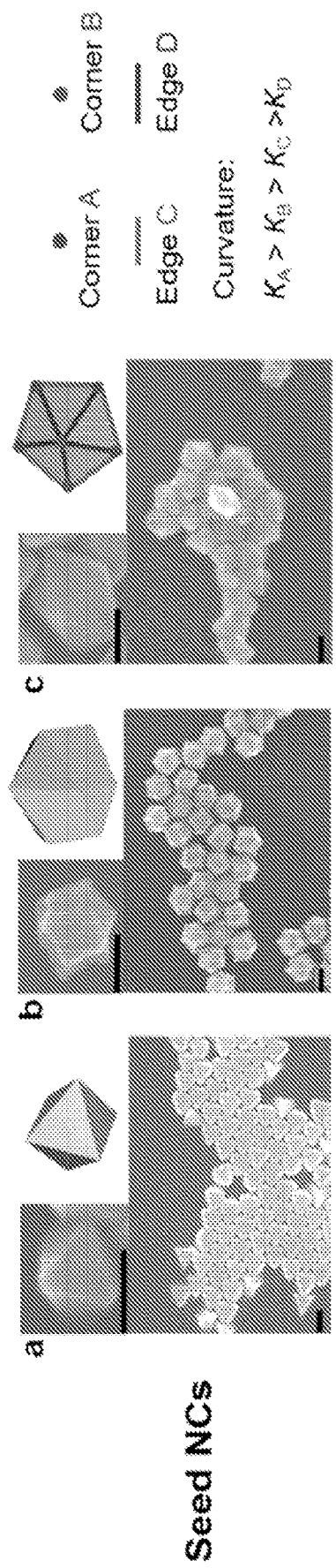
FIG. 4A is an SEM image and model (inset upper right) of octahedral seed nanocrystals. Scale bar: 100 nm.
FIG. 4B is an SEM image and model (inset upper right) of concave rhombic dodecahedral seed nanocrystals. Scale bar: 100 nm.
FIG. 4C is an SEM image and model (inset upper right) of decahedral seed nanocrystals, contain two types of corners (A & B) and two types of edges (C & D) due to curvature differences such that $K_A > K_B > K_C > K_D$, which result in four levels of continuous but independent control of selective nucleation. Scale bar: 100 nm.
Figures 4D, 4E, 4F, 4G:
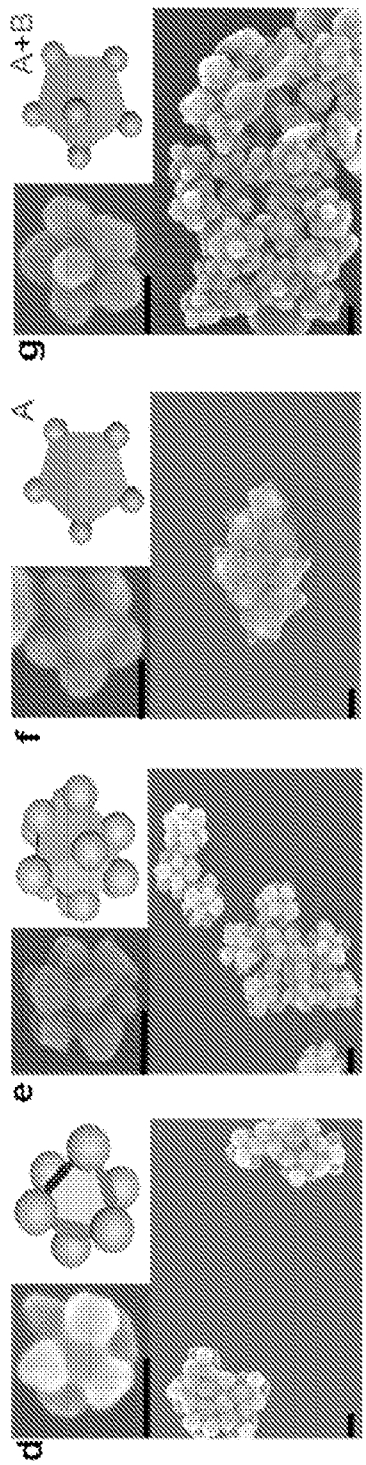
FIG. 4D is an SEM image and model (inset upper right) of corner-selective nucleation on the seed nanocrystals of FIG. 4A. Scale bars: 100 nm.
FIG. 4E is an SEM image and model (inset upper right) of corner-selective nucleation on the seed nanocages of FIG. 4B. Scale bar: 100 nm.
FIG. 4F is an SEM image and model (inset upper right) of corner-selective nucleation on the seed nanocrystals of FIG. 4C grown on corner A. Scale bar: 100 nm.
FIG. 4G is an SEM image and model (inset upper right) of corner-selective nucleation on the seed nanocrystals of FIG. 4C grown on corners A and B. Scale bar: 100 nm.
Figures 4H, 4I, 4J, 4K:
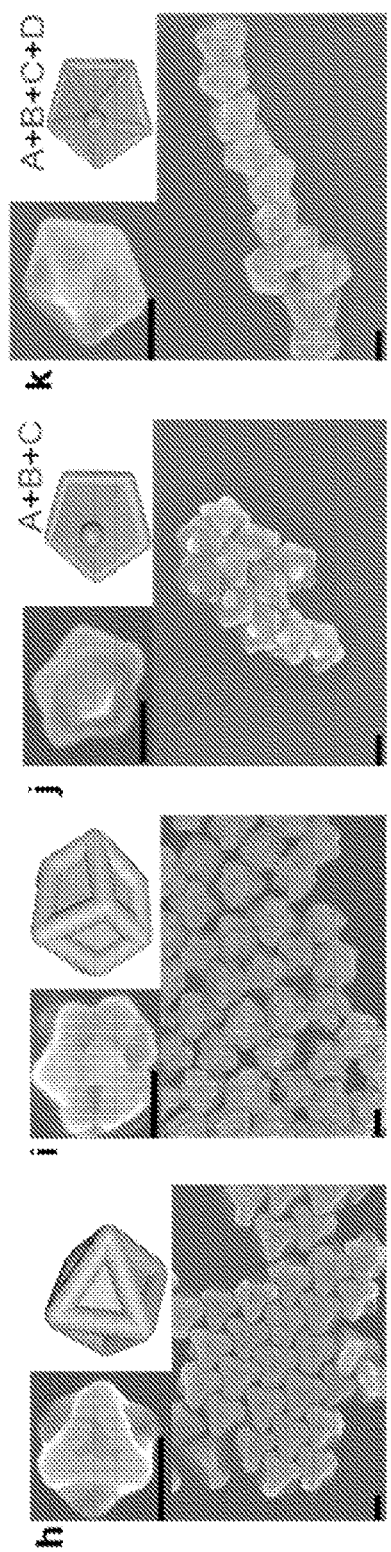
FIG. 4H is an SEM image and model (inset upper right) of edge-selective nucleation on the seed nanocrystals of FIG. 4A. Scale bar: 100 nm.
FIG. 4I is an SEM image and model (inset upper right) of edge-selective nucleation on the seed nanocrystals of FIG. 4B. Scale bar: 100 nm.
FIG. 4J is an SEM image and model (inset upper right) of edge-selective nucleation on the seed nanocrystals of FIG. 4C grown on edge C. Scale bar: 100 nm.
FIG. 4K is an SEM image and model (inset upper right) of edge-selective nucleation on the seed nanocrystals of FIG. 4C grown on edges C and D. Scale bar: 100 nm.
Figure 5A:
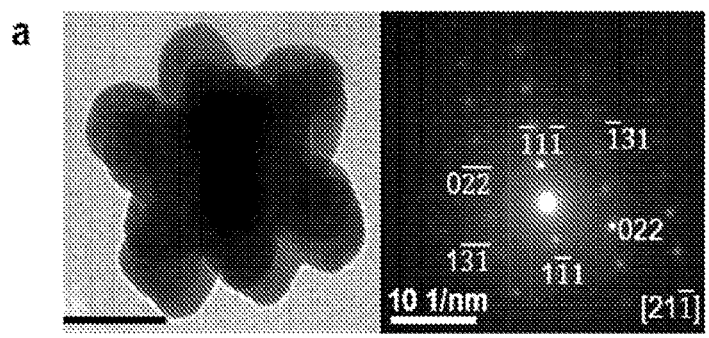
FIG. 5A is a TEM image (left) and corresponding SAED image (right) of the corner-selective growth of concave rhombic dodecahedra. Scale bars: 2 µm.
Figure 5B:
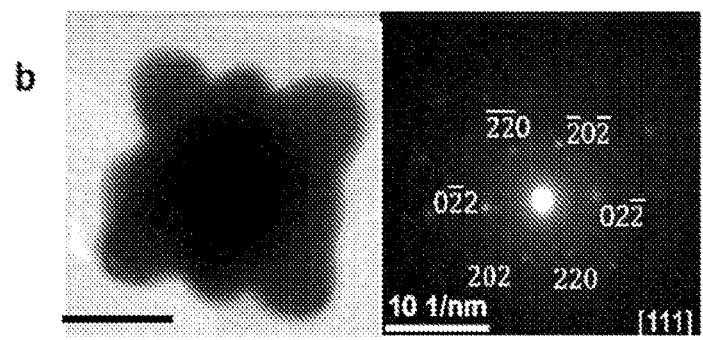
FIG. 5B is a TEM (left) and corresponding SAED image (right) of the edge-selective growth of concave rhombic dodecahedra. Scale bars: 2 µm.
Figure 18:
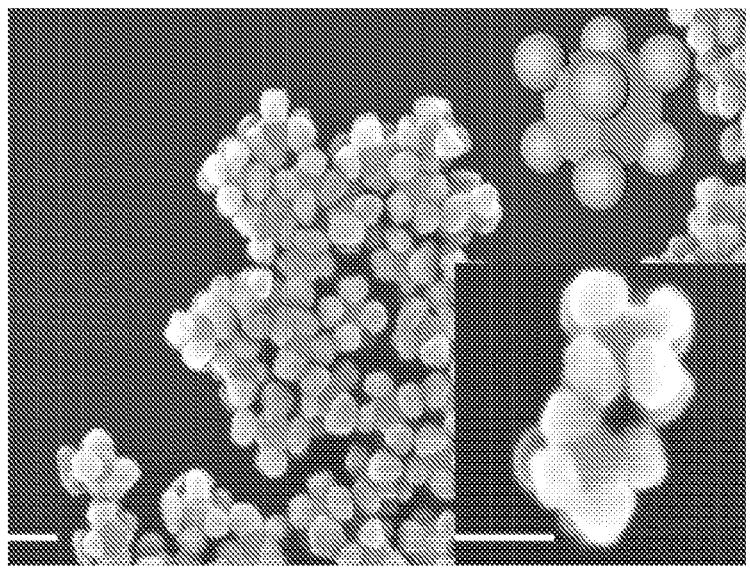
FIG. 18 is an SEM image of corner-selective growth of nanocubes in accordance with methods of the disclosure. Scale bars, 100 nm.

Curvature-selective growth was performed and analyzed using various polyhedral shaped seeds. Referring to FIGS. 4A and 4B, octahedral and concave rhombic dodecahedral gold seeds have corners and edges with different curvatures. It was found that regardless of the polyhedral geometry of the seeds, site-specific gold deposition only at the corners or only at the edges was obtained by changing the concentration reducing agent to tune the supersaturation $\Delta\mu$ relative to the energy barrier profile. In the examples shown in FIGS. 4 and 5, the reducing agent was ascorbic acid. Referring to FIG. 5, corner- and edge-selective growth concave rhombic dodecahedra formation were confirmed by SAED pattern. The diffraction patterns shown in FIGS. 5A and 5B were characteristic of [21$\bar{1}$] and [111] orientations, respectively. FIG. 18 illustrates corner selective growth on nanocubes. The corners of nanocubes have higher curvatures than the edges, such that $E_{corner}<E_{edge}$. When $E_{corner}<\Delta\mu<E_{edge}$, the corners of the nanocubes were selectively deposited.

It was further observed that when the seed had multiple types of corners or edges that are energetically nonequivalent, the supersaturation $\Delta\mu$ can be further tuned so that the nucleation occurs preferentially at lower-energy barrier sites first. Referring to FIG. 4C, in decahedral gold seeds with two types of corners, A, B, and two types of edges C, D ($K_A>K_B>K_C>K_D$), four levels of continuous but independent control are possible over the selective growth on the different corners (FIGS. 4F and 4G) and edges (FIGS. 4J and 4K). The sites can be grown successively in the following progression (i) site A, (ii) sites A and B, (iii) sites A, B, and C, and (iv) sites A, B, C, and D.

Figure 6A:
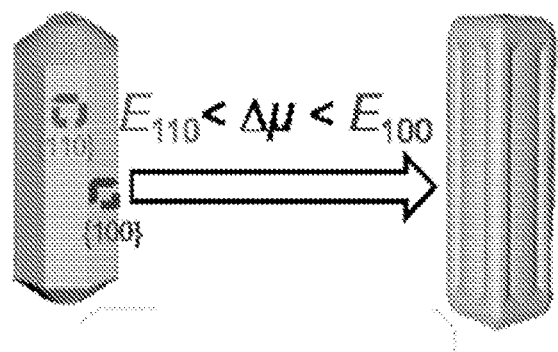
FIG. 6A is a schematic of facet-selective growth on a Au nanorod, where growth can occur on the {110} facets of the seed nanocrystal by tuning $\Delta\mu$.
Figure 6B:
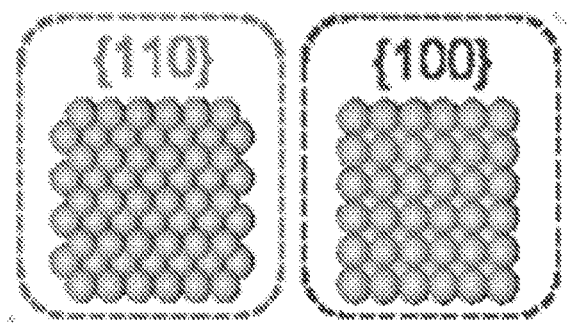
FIG. 6B is a schematic of the {110} and {100} facets.
Figure 6C:
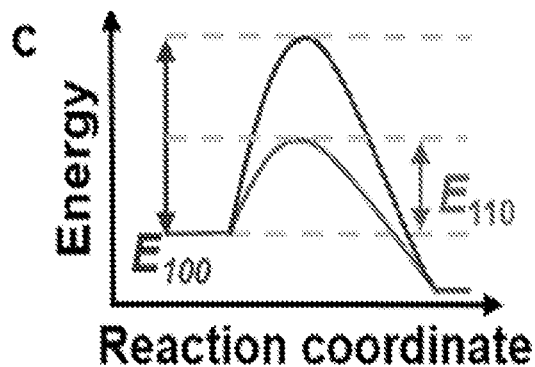
FIG. 6C is a graph showing the idealized E profile for nanocrystal growth is dictated by the facet's energy, where $E_{110} < E_{100}$.
Figure 6D:
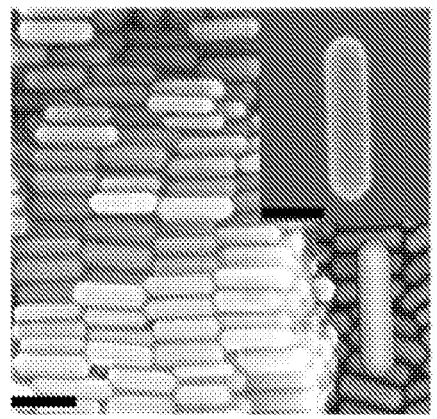
FIG. 6D is an SEM image Au nanorods. Scale bar: 100 nm.
Figure 6E:
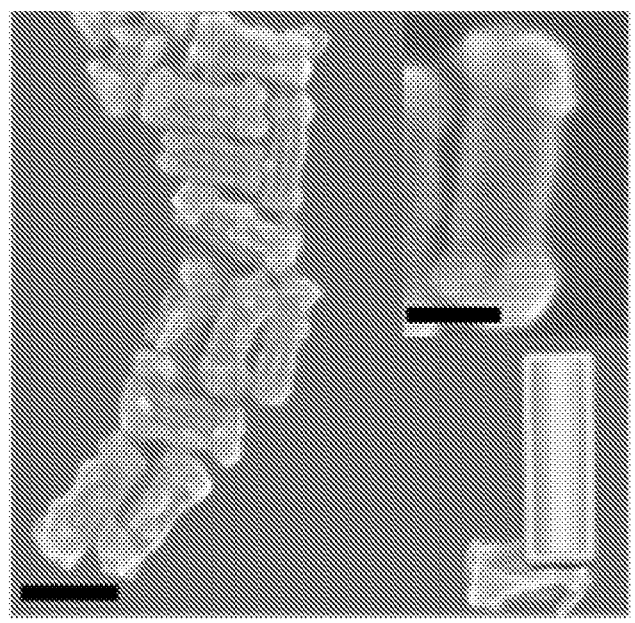
FIG. 6E is an SEM image of {110} facet-selective growth on nanorods. Scale bar: 100 nm.
Figure 6F:
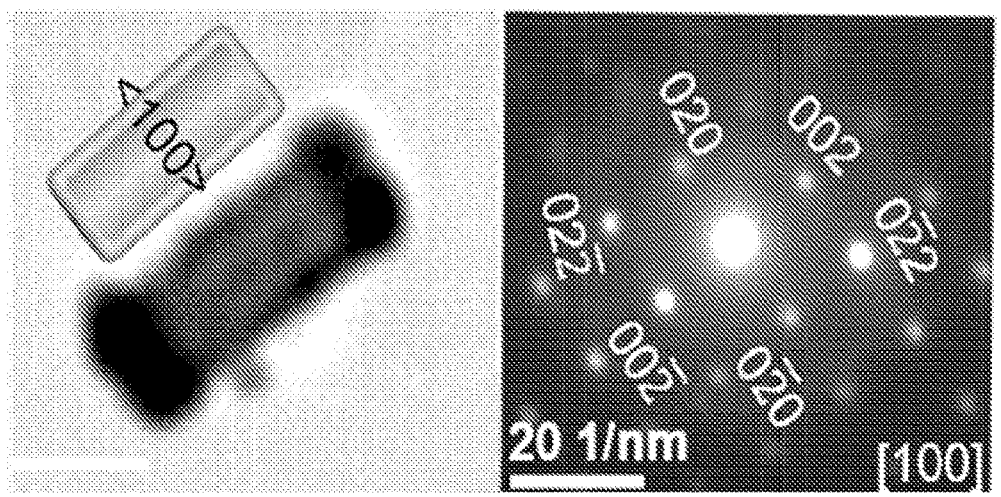
FIG. 6F is a TEM image and corresponding SAED pattern of nanorods with {110} facet-selective growth oriented along the [100] direction. Scale bar: 100 nm.
Figure 6G:
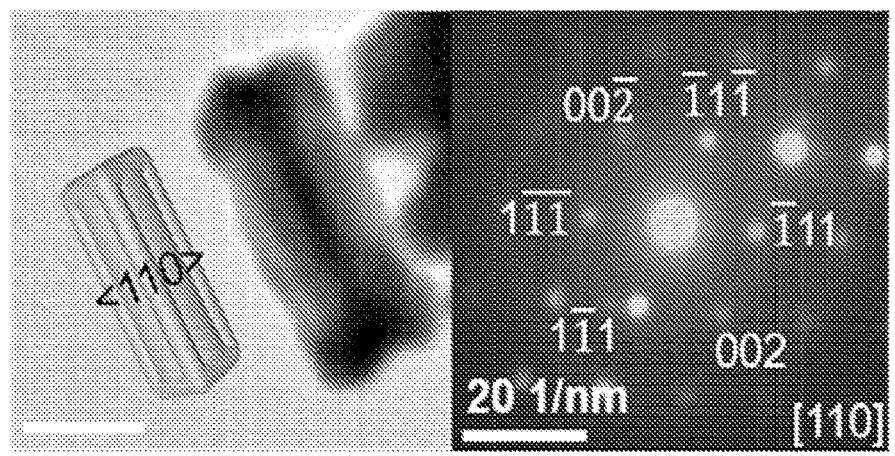
FIG. 6G is a TEM image and corresponding SAED pattern of nanorods with {110} facet-selective growth oriented along the [110] direction. Scale bar: 100 nm.

It was further found that facet energy ($\sigma$) differences can also be used for controlling subsequent nanocrystal nucleation. It was found that facets with higher surface energies grow at smaller supersaturation $\Delta\mu$. Referring to FIG. 6, to decouple the effect of facet from that of curvature, the edges of nanorods with no curvature differences were used in the illustrated system. This was for illustrative and analysis purposes only. It is contemplated herein that seed with edge curvature differences and facet surface energy differences can be used. From the example illustrated in FIG. 6, it was observed that the higher the facet surface energy ($\sigma$), which results from a lower coordination number, the lower the energy barrier E and the easier it is for solutes to access the site for subsequent nucleation. Referring to FIG. 6A, thus it was found that by adjusting the $\Delta\mu$-E relationship, specific facet-selective nucleation windows can be reached. Referring to FIGS. 6B and 6C, the edges of the nanorods are bound by alternating {100} and {110} facets, where $\sigma_{\{110\}}>\sigma_{\{100\}}$ such that $E_{\{110\}}<E_{\{100\}}$. Referring to FIGS. 6D and 6E, gold atoms can be selectively deposited on the four {110} facets of the nanorod edges when $\Delta\mu$ can only surmount $E_{\{110\}}$. Referring to FIG. 6F, selected area electron diffraction (SAED) patterns confirmed that the newly grown parts are in the direction of the <110> zone axis of the nanorods, while the parts in the orientations of the <100> zone axis did not grow. This confirmed the {110} face-selective nucleation and growth.

Figure 6H:
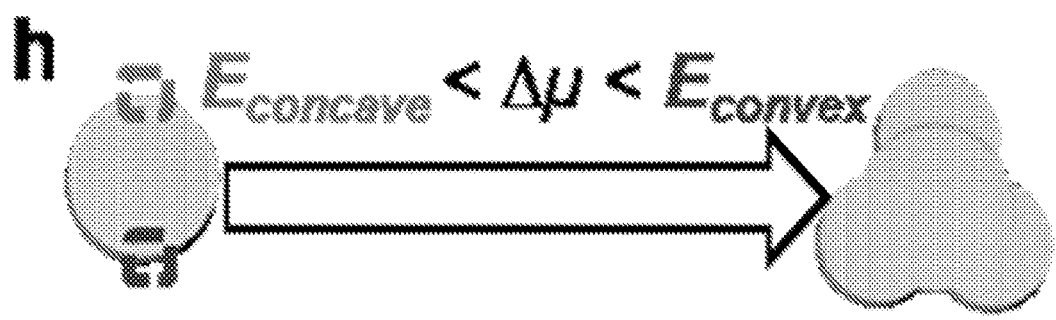
FIG. 6H is a schematic of concave-type facet-selective nucleation on nanodisks, where the concave-type facet-selective window can be reached by tuning $\Delta\mu$.
Figure 6I:
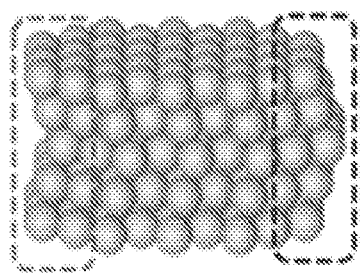
FIG. 6I is a schematic side-view of a nanodisk showing the concave- and convex-type facets.
Figure 6J:
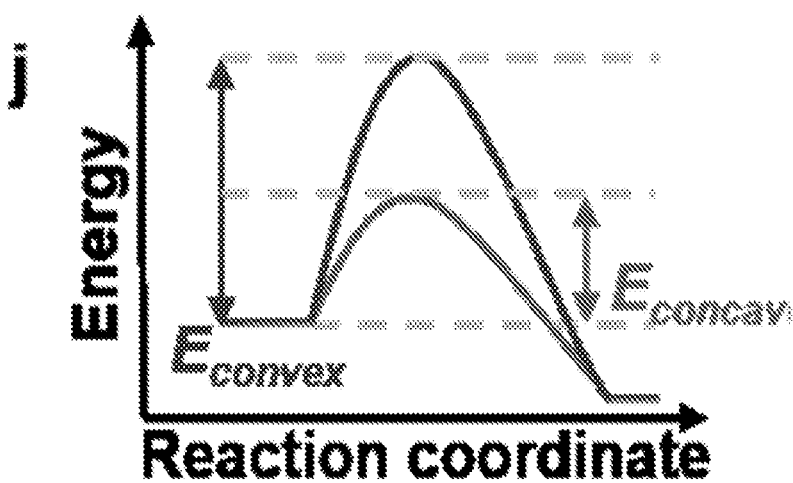
FIG. 6J is a graph showing the general trend of the E profile of nanodisks, where $E_{concave} < E_{convex}$.
Figure 6K:
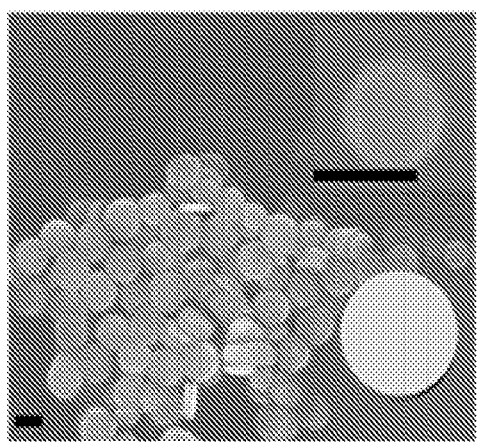
FIG. 6K is an SEM image of AU nanodisk. Scale bar: 100 nm.
Figure 6L:
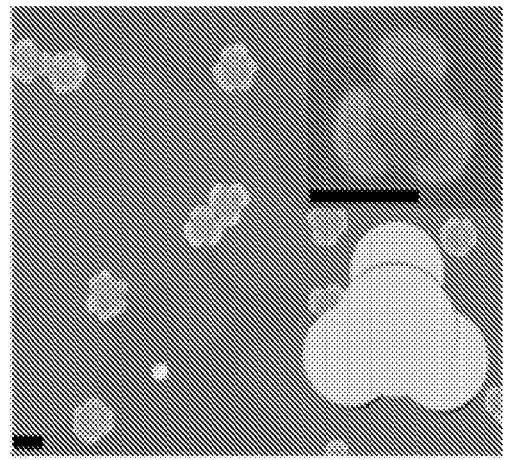
FIG. 6L is an SEM image of facet-selective grown nanodisks. Scale bar: 100 nm.

Face-selective growth methods can also be applied to tailor nanostructures when gold nanodisks are used as seeds. Referring to FIG. 6H, gold nanodisks were synthesized by etching triangular nanoprisms, and the three areas of the resulting nanodisks that used to be the prism corners have the same atomic arrangement as that of the original nanoprism corners. Along the edges of the nanodisks, the stacking fault of the twin plane causes {111} faces to form in alternating concave or convex orientations as shown in FIG. 6I. The concave structure creates a reentrant groove, a self-perpetuating ledge that increases the number of nearest neighbors for an adatom, increasing the stabilization energy, and greatly decreasing the energy barrier $E_{concave}$. However, on the convex side, an adatom attached to a surface has limited stabilization energy due to the presence of only three nearest neighbors, resulting in high energy barrier $E_{convex}$ (FIG. 6J). This results in deposition selectively occurring on the concave-type facets when $E_{concave}<\Delta\mu<E_{convex}$. This is illustrated in FIG. 6L. Referring to FIGS. 6M and 6N, SAED patterns show that the edges were grown in the same directions as the three original corners of the nanoprisms, thus confirming concave-type facet-selective nucleation.

In addition to spatial control over nucleation, it was found that the $\Delta\mu$-E relationship can be turned to control the exposed facets on the grown regions, thus programming the resulting shapes of the nanocrystals. Based on the Thomson-Gibbs equation, in a growing crystal, facets with higher surface energies will appear when the Δμ of the growth solution is higher. In particular, the Thomson Gibbs equation states:

$$\Delta\mu = (2\sigma v)/h \quad (2)$$

where Δμ is the supersaturation, a is the specific surface energy of crystallite, v is the volume of single building block assuming the nucleus is spherical, and h is the distance from the center to the surface of the crystallite. Based on this equation (2), the surface energy of crystal face is in proportion to the supersaturation of crystal growth units during crystal growth. Therefore, the exposed crystal faces can be simply tuned by controlling the supersaturation, and higher supersaturation will result in the formation of crystallites with higher surface energy facets.

Figures 7D, 7E, 7F, 7G:
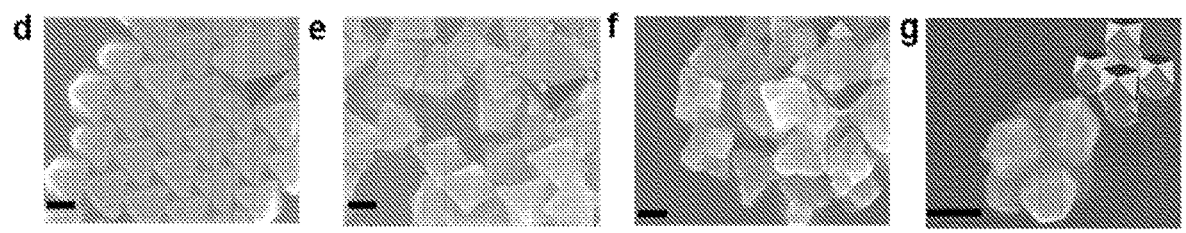
FIG. 7D is an SEM image of Au octahedra. Scale bar: 100 nm
FIG. 7E is an SEM image of corner-nucleated octahedra. Scale bar: 100 nm.
FIG. 7F is an SEM image of Au octahedra after corner-selective growth with {111} facets exposed. Scale bar: 100 nm.
FIG. 7G is an SEM image of Au octahedra after corner-selective growth with {100} and {111} facets exposed. Scale bar: 100 nm.
Figures 7H, 7I, 7J, 7K:
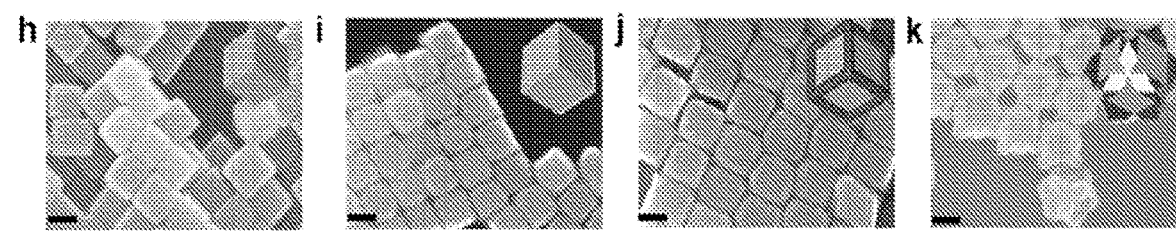
FIG. 7H is an SEM image of Au nanocubes. Scale bar: 100 nm.
FIG. 7I is an SEM image of edge-nucleated nanocubes. Scale bar: 100 nm.
FIG. 7J is an SEM image of nanocubes after edge-selective growth with {100} facets exposed. Scale bar: 100 nm.
FIG. 7K is an SEM image of nanocubes after edge-selective growth with {100} and {111} facets exposed.
Figure 9:
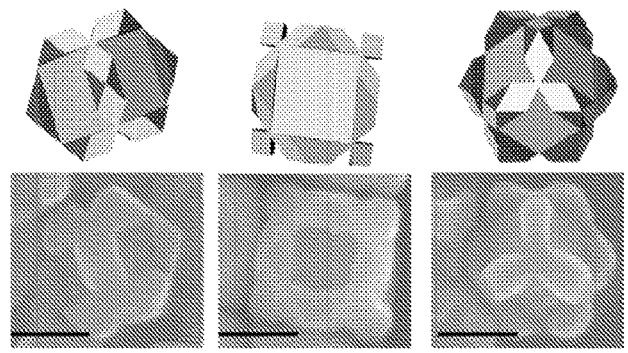
FIG. 9 is an SEM image and schematic representation of different viewing angles of edge-selective grown nanocubes exposed with {100} and {111} facets made by a method in accordance with embodiments of the disclosure. Scale bar 100 nm.
Figure 10A:
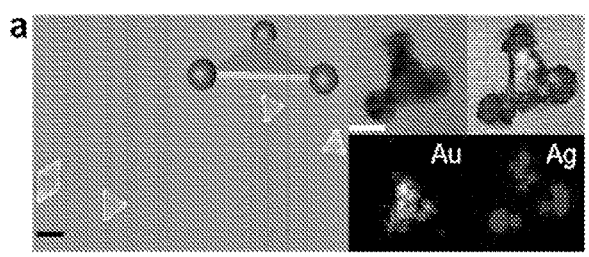
FIG. 10A is SEM image and corresponding elemental map of corner-selective growth of Ag on Au nanoprisms. Scale bar: 100 nm.
Figure 10B:
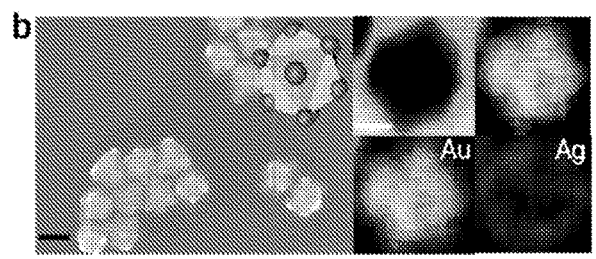
FIG. 10B is SEM image and corresponding elemental map of corner-selective growth of Ag on Au concave rhombic dodecahedra. Scale bar: 100 nm.
Figure 10C:
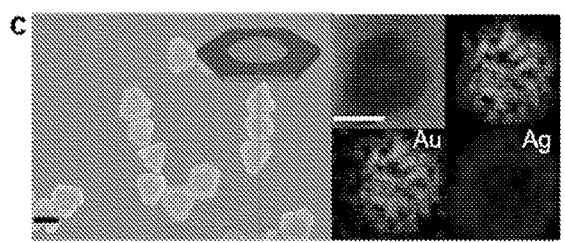
FIG. 10C is SEM image and corresponding elemental map of edge-selective growth of Ag on Au nanoprisms. Scale bar: 100 nm.
Figure 10D:
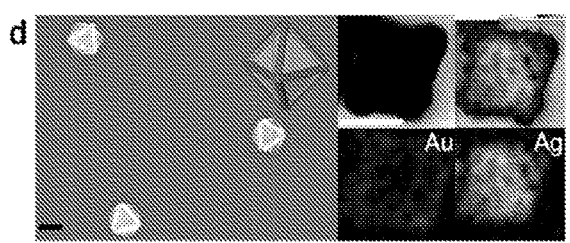
FIG. 10D is SEM image and corresponding elemental map of edge-selective growth of Ag on Au octahedral. Scale bar: 100 nm
Figures 10E, 10F:
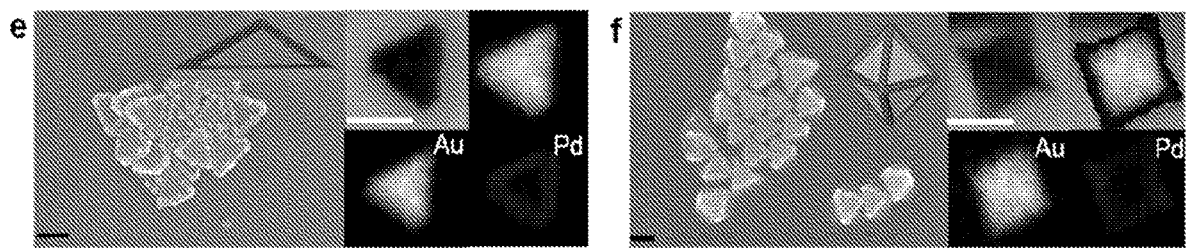
FIG. 10E is SEM and elemental maps showing edge-selective growth of Pd on Au nanoprism. Scale bar: 100 nm.
FIG. 10F is SEM and elemental maps showing edge-selective growth of Pd on Au octahedra. Scale bar: 100 nm.

For example, referring to FIG. 7A, in the case of gold nanocubes and octahedra, the surface energy of {100} in dark shading is higher than that of {111} in light shading (FIG. 7A). Therefore, using corner-nucleated octahedra as seeds (FIG. 7B, 7E), growth occurs almost exclusively on the existing nuclei on the corners. The corners are bound by {111} facets at lower Δμ (100 mM CTAB) (FIG. 7B, 7F), while the {100} facets begin to appear on the corners at higher Δμ (10 mM CTAB) (FIG. 7B, 7G). Moreover, when edge-nucleated nanocubes are used as seeds (FIG. 7C, 7I), subsequent growth only occurs on the existing nuclei along the edges. The edges are bound by {100} facets at higher Δμ (10 mM CTAB) (FIG. 7C, 7J), while the {111} facets begin to appear along the edges at lower Δμ (100 mM CTAB) (FIG. 7C, 7K, FIG. 9)

Figure 8A:
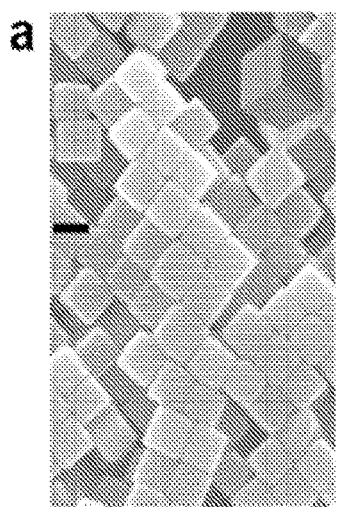
FIG. 8A is an SEM image of Au nanocubes. Scale bar: 100 nm.
Figures 8B, 8C, 8D:
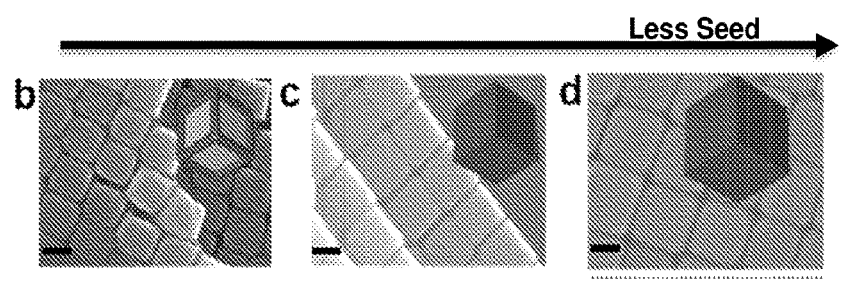
FIG. 8B is an SEM image of Au nanocubes after edge-selective growth. Scale bar: 100 nm.
FIGS. 8C and 8D are SEM images of the AU nanocube of FIG. 8B showing evolution of the shape of the nanostructure as a function of the amount of deposition on each seed.
Figures 8E, 8F, 8G:
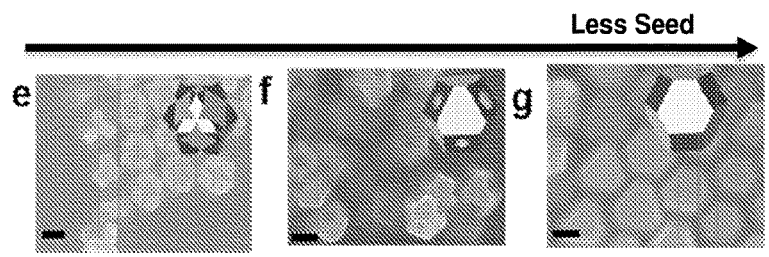
FIG. 8E is an SEM image of Au nanocubes after corner-selective growth.
FIGS. 8F and 8G are SEM images of the nanocubes of 8E, showing the evolution of the shape of a nanostructure as a function of the amount of deposition on each seed.

A broad library of structures with specific exposed facets can be obtained by controlling the concentration of the seeds in addition to supersaturation Δμ. For example, referring to FIGS. 8 and 16, decreasing the amount of cubic seeds was found to increase the amount of deposition on each seed and resulted in larger cubes (FIGS. 8B-8D), when combined with high supersaturation. However, at low supersaturation, increasing the number of cubic seeds resulted in the initial formation of incompletely formed truncated octahedra (a central part of each {100} facet did not completely grow). Ultimately, these structures grow into fully formed truncated octahedra (FIG. 8E-8G). These results are consistent with the observed exposed-facet-design rule that facets with higher surface energies are exposed at higher supersaturation Δμ.

It is also found herein that the exposed-facet design rule be applied to seeds of different shapes, such as concave rhombic dodecahedra and nanodisks (FIG. 16). This increases the number and diversity of nanostructures that can be formed using the seed-mediated synthesis methods of the disclosure.

The methods of the disclosure can also expand the compositional library of nanocrystals that can be formed through the site-specific growth. FIG. 10 illustrates that site-directed growth can be similarly controlled when depositing different metal ions from a growth solution. In the example illustrated in FIG. 10, corner- or edge-selective growth of Ag or Pd onto gold nanocrystal seeds of different shapes, including nanoprisms, octahedra, and concave rhombic dodecahedra, was performed using the methods of the disclosure. Elemental mapping confirmed the spatial arrangement of the nanocrystals.

As detailed above, for nanocrystal growth, the driving force Δμ (supersaturation) is the difference between the chemical potential of the solute in solution ($\mu_l$) and that of the solid crystal ($\mu_c$). The supersaturation Δμ of the growth solution can be tuned by changing the reaction conditions. For example, increasing the concentration of the reducing agent or decreasing the concentration of the complexing agent can increase the supersaturation Δμ. In embodiments, the growth solution includes a reducing agent, a complexing agent, and a nanocrystal precursor.

In embodiments, the reducing agent can be ascorbic acid, hydroxylamine hydrochloride, or hydrazine hydrate. Other suitable reducing agents can be readily determined by the skilled person. In particular, any reducing agent having a lower redox potential than that of the grown material and a higher redox potential than that of $H_2/H^+$ (0V) can be used. The concentration of the reducing agent and/or the pH conditions can be adjusted in the growth solution to tune the chemical potential and thereby achieve site-specific growth.

In embodiments, the complexing agent can be any one or more of cetyltrimethylammonium bromide (CTAB), tetraoctylammonium bromide (TOAB), cetylpyridinium chloride (CPC), cetyltrimethylammonium chloride (CTAC), and hexadecylpyridinium bromide. Other complexing agent that contain bromide (Br) or chloride (Cl⁻) are also contemplated herein.

In embodiments, the growth process can be divided into two steps. Using gold nanoseeds as an example, the method can include:

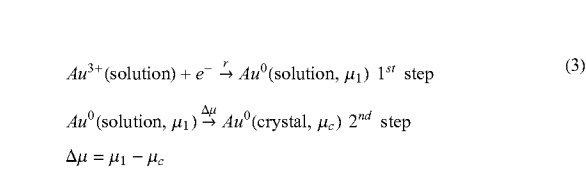

$$Au^{3+}(\text{solution}) + e^- \xrightarrow{r} Au^0(\text{solution}, \mu_1) \quad 1^{st} \text{ step} \quad (3)$$

$$Au^0(\text{solution}, \mu_1) \xrightarrow{\Delta\mu} Au^0(\text{crystal}, \mu_c) \quad 2^{nd} \text{ step}$$

$$\Delta\mu = \mu_1 - \mu_c$$

where r is the reduction reaction rate of Au precursor ($Au^{3+}$) and Δμ is the supersaturation of the gold crystal growth units. $Au^{3+}$ cations are first reduced to gold atoms ($1^{st}$ step), and then the gold atoms deposit on the crystallites ($2^{nd}$ step), driven by the supersaturation Δμ. For a given system, as $\mu_c$ is a nearly constant value at a given temperature, it can be concluded from equation (3) that Δμ can be enhanced by increasing pi. For a species in solution, $$\mu_l = \mu_l^\ominus + RT \ln C \quad (4)$$

where $\mu_l^\ominus$ stands for the standard chemical potential of the species in solution, T is the temperature, C is the concentration of the species, and $\mu_l$ stands for the chemical potential of the species in solution with the concentration C. For a given temperature and solvent, $\mu_l^\ominus$ is a constant, and therefore $\mu_l$ can be enhanced by increasing C.

According to the first step, C can be tuned by changing r, thus changing $\mu_l$. Experimentally, on the one hand, r can be increased by increasing the reduction agent (AA) concentration. On the other hand, it is known that the complexing agent CTAB complexes with $Au^{3+}$ to decrease its concentration, such that the reaction and crystal growth rate would increase with decreasing concentrations of CTAB. Therefore, $\mu_l$ can be increased by experimentally increasing the AA or decreasing the CTAB concentration, both result in increasing Δμ in the growth solution. From the results observed with gold, it was concluded that $\mu_l$ can be increased by experimentally increasing the AA or decreasing the complexing agent concentration, both result in increasing Δμ in the growth solution. Other suitable complexing agents can be used and include, for example, cetylpyridinium chloride (CPC) or cetyltrimethylammonium chloride (CTAC)).

In embodiments, the nanocrystal precursor material can be selected depending on the nanocrystal to be grown. For example, for gold nanocrystals, the precursor can be hydrogen tetrachloroaurate-(III). For example, for a precursor for growing Pd on a seed can be $H_2PdCl_4$. For example, a precursor for growing Ag on a seed can be $AgNO_3$. Any suitable precursors for a desired metal ion can be used herein. Growth of other metal structures, such as Pt and Cu, as well as semiconductor materials and oxides, such as $Cu_2O$ and $TiO_2$ can also be grown. Suitable precursor materials for growth of such materials are known in the art. For example, other precursors can include $H_2PtCl_6$, $CuCl_2$, $Cu_2(OAc)_4$.

EXAMPLE

In each of the examples, the following materials and procedures were used.

Materials: Ascorbic acid (AA, 99%), cetyltrimethylammonium bromide (CTAB, 99%), hydrogen tetrachloroaurate-(III) ($HAuCl_4 \cdot 3H_2O$, 99.9+%), sodium chloride (NaCl, 99.5%), trisodium citrate dihydrate (sodium citrate, 99.9%), hydrochloric acid (HCl), sodium hydroxide (NaOH, 97%), silver nitrate ($AgNO_3$, 99.9999%), sodium borohydrate ($NaBH_4$, 99.99%), palladium(II) chloride ($PdCl_2$, 99.9+%), cetylpyridinium chloride (CPC, 99+%), sodium dodecyl sulfate (SDS, 99+%), sodium iodide (NaI, 99%) and sodium oleate (99+%) were purchased from Sigma Aldrich. mPEG6 disulfide was purchased from Polypure. PEG5k thiol was purchased from Nanocs. All the chemicals were used as purchased without further purification.

Synthesis of Cubic, Octahedra, and Concave Rhombic Dodecahedra Seeds: Cubic, octahedral, and concave rhombic dodecahedral gold nanocrystals (NCs) were synthesized via literature methods for used as the seeds. O'Brien, M. N., Jones, M. R., Brown, K. A. & Mirkin, C. A. Universal noble metal nanoparticle seeds realized through iterative reductive growth and oxidative dissolution reactions. J. Am. Chem. Soc. 136, 7603-7606 (2014). Iterative oxidative dissolution and reductive growth reactions were utilized to control nanocrystal seed structural uniformity. Subsequently, these seeds were used to template the growth of different anisotropic NCs: cubes, octahedra, and concave rhombic dodecahedra.

Synthesis and Purification of Triangular Nanoprisms: Gold nanoprisms were synthesized according to Millstone et al. Millstone, J. E., Wei, W., Jones, M. R., Yoo, H. & Mirkin, C. A. Iodide Ions Control Seed-Mediated Growth of Anisotropic Gold Nanoparticles. Nano Lett. 8, 2526-2529 (2008). The synthesis of nanoprisms resulted in a significant number of pseudo-spherical NC impurities. To isolate the triangular nanoprisms, a depletion-force mediated procedure reported by Young et al. was utilized. Briefly, the unpurified nanoprisms were transferred to 15 mL Falcon tubes and brought to 0.2 M NaCl. Young, K. L. et al. Assembly of reconfigurable one-dimensional colloidal superlattices due to a synergy of fundamental nanoscale forces. Proc. Natl. Acad. Sci. 109, 2240-2245 (2012). After 1 hour, this solution was centrifuged for 10 seconds at 6,000 rpm. The supernatant, containing the impurities, was removed. The triangular nanoprisms were then resuspended in 50 mM CTAB.

Synthesis of nanodisks: Nanoprisms with edge lengths of 170 nm were synthesized and purified, and they were subsequently etched to nanodisks utilizing procedures reported by Rodriguez-Fernandez et al. and O'Brien et al. Rodríguez-Fernández, J., Pérez-Juste, J., Mulvaney, P. & Liz-Marzán, L. M. Spatially-Directed Oxidation of Gold Nanoparticles by Au(III)-CTAB Complexes. J. Phys. Chem. B 109, 14257-14261 (2005); O'Brien, M. N., Jones, M. R., Kohlstedt, K. L., Schatz, G. C. & Mirkin, C. A. Uniform Circular Disks With Synthetically Tailorable Diameters: Two-Dimensional Nanoparticles for Plasmonics. Nano Lett. 15, 1012-1017 (2015). First, 10 mM hydrogen tetrachloroaurate-(III) ($HAuCl_4$) was added to a 6 pM nanoprism and 50 mM CTAB mixture under vigorous stirring to bring the final concentration of $HAuCl_4$ to 12 μM. After the solution was mixed thoroughly, the solution was kept at 28° C. After 4 hours, the solution was centrifuged for 10 min at 10,000 rpm, the supernatant was removed, and the nanodisks were resuspended in 50 mM CTAB.

Synthesis of nanorods: Gold nanorods were synthesized using a seed-mediated approach reported by Ye et al. Ye, X., Zheng, C., Chen, J., Gao, Y. & Murray, C. B. Using Binary Surfactant Mixtures To Simultaneously Improve the Dimensional Tunability and Monodispersity in the Seeded Growth of Gold Nanorods. Nano Lett. 13, 765-771 (2013). Briefly, the seed solution was prepared by adding 1 mL of fresh 6 mM $NaBH_4$ solution into a 10 mL mixture consisting of 5 mL of 0.5 mM $HAuCl_4$ and 5 mL of 0.2 M CTAB, which then was vigorously stirred for 2 min followed by aging at 28° C. for 30 min. To prepare the growth solution, 9.0 g of CTAB and 1.234 g of sodium oleate were dissolved in 250 mL of distilled water and heated to 50° C. After being cooled to 28° C., 24 mL of 4 mM $AgNO_3$ solution was added, and the mixture was undisturbed at 30° C. for 15 min. Then, 10 mL of 25 mM $HAuCl_4$ solution and 240 mL $H_2O$ were added. After 90 min of gentle stirring, 3.6 mL of 12 M HCl was introduced into this solution. Another 15 min later, 0.8 mL of 0.1 M AA was added, and the solution was vigorously stirred for 30 s. Finally, 10 μL of seed solution was injected into this growth solution and stirred for 40 s. After keeping the growth solution undisturbed at 28° C. for 12 hours, the Au nanorods were centrifuged to remove the growth solution and resuspended in 50 mM CTAB.

Synthesis of decahedra: The seeds for decahedra synthesis were synthesized through thermal treatment of small Au seeds, resulting in extensive twinning. Sanchez-Iglesias, A. et al. High-Yield Seeded Growth of Monodisperse Pentatwinned Gold Nanoparticles through Thermally Induced Seed Twinning. J. Am. Chem. Soc. 139, 107-110 (2017). Then, 10 mL of 100 mM cetylpyridinium chloride (CPC), 200 μL of 25 mM $HAuCl_4$, and 75 μL of 100 mM AA were mixed. Afterwards, 5 μL of seeds were injected into the solution, and the solution was allowed to react overnight.

Functionalization of anisotropic nanocrystals: Anisotropic nanocrystals were functionalized with mPEG6 disulfide. 1 mL aliquots of the as-synthesized nanocrystal solution were centrifuged for 6 min at 5,000-10,000 rpm depending on the nanocrystal shape used. After the supernatant was removed, the nanocrystals were resuspended in water and centrifuged a second time under the same centrifugation conditions as the first time. After removal of the supernatant, 900 μL of 1 μM mPEG6 disulfide and 100 μL of 1 wt. % sodium dodecyl sulfate (SDS) were added directly to the pellet. The nanocrystal solution was placed on a shaker at 1,000 rpm for 1 day. To remove excess mPEG6 disulfide, the NC solution was centrifuged three times with the supernatant removed each time, and then the nanocrystals were resuspended in 0.1 wt. % SDS after the first two centrifugation steps and in 10 mM CTAB after the third centrifugation step. All the functionalized nanocrystals used as seeds for the following experiments were at a 10 OD concentration.

Scanning electron microscope (SEM) imaging: In the examples, SEM imaging was done by adding 50 μL of nanocrystal solution to a 1-mL Eppendorf tube and diluting with $H_2O$. The supernatant was then removed after centrifugation, and the pellet was resuspended in 50 μL of $H_2O$.

Then, 20 µL droplets of the nanocrystal solution were placed onto silicon chips and the substrate was dried in a vacuum desiccator at room temperature.

Transmission electron microscopy (TEM) imaging: In the example, TEM imaging was done by adding 50 µL of nanocrystal solution to a 1-mL Eppendorf tube and diluting with $H_2O$. The supernatant was removed after centrifugation, and the pellet was resuspended in 50 µL of $H_2O$. Then, 5 µL droplets of nanocrystal solution were pipetted onto a TEM grid, and it was dried in a vacuum desiccator at room temperature.

Example 1: Effect of Different Ligands

To study the effect of ligands with different lengths and binding affinities, gold nanoprisms functionalized with mPEG6 disulfide ($CH_3O$—$(CH_2CH_2O)_6$—$CH_2CH_2$—S—S—$CH_2CH_2$—$(CH_2CH_2O)_6$—$OCH_3$) or mPEG5k thiol ($CH_3O$—$(CH_2CH_2O)_n$—$CH_2CH_2$—SH, molecular weight: 5,000 g/mol). The nanocrystal seeds were functionalized with mPEG6 disulfide using the method described above and with the mPEG5K thiol using the same method described above for the mPEG6 disulfide. A control was run using gold nanoprism having no ligand functionality. Sixty µL of these three types of seeds were individually injected into three batches of the same growth solution, containing 1.25 mL of 10 mM CTAB, 6.24 µL of 25 mM $HAuCl_4$, and 2 µL of 100 mM AA. Then, the solutions were allowed to react for 4 hours. Disulfide and thiol ligands were selected for their high affinity for gold surfaces and their ability to displace CTAB bilayers.

Figure 12A:
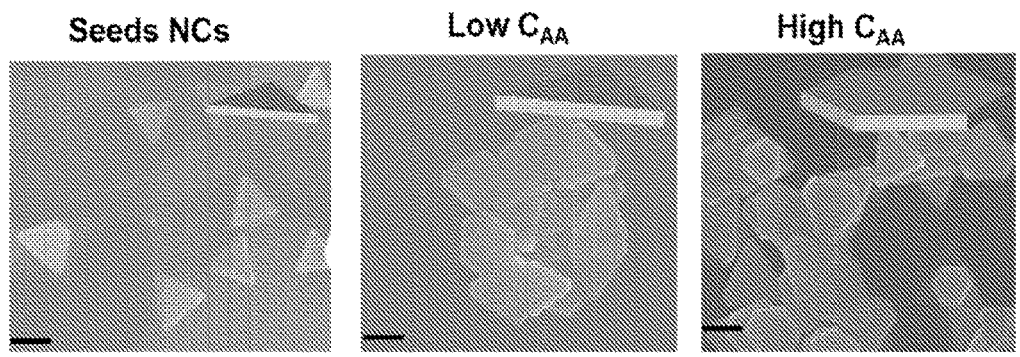
FIG. 12A is an SEM image of nanocrystals grown using nanoprisms as seeds with increasing AA concentrations (Low $C_{AA}$: 0.2 mM AA in growth solution; High $C_{AA}$: 1 mM AA in growth solution). Scale bars: 100 nm.
Figure 12B:
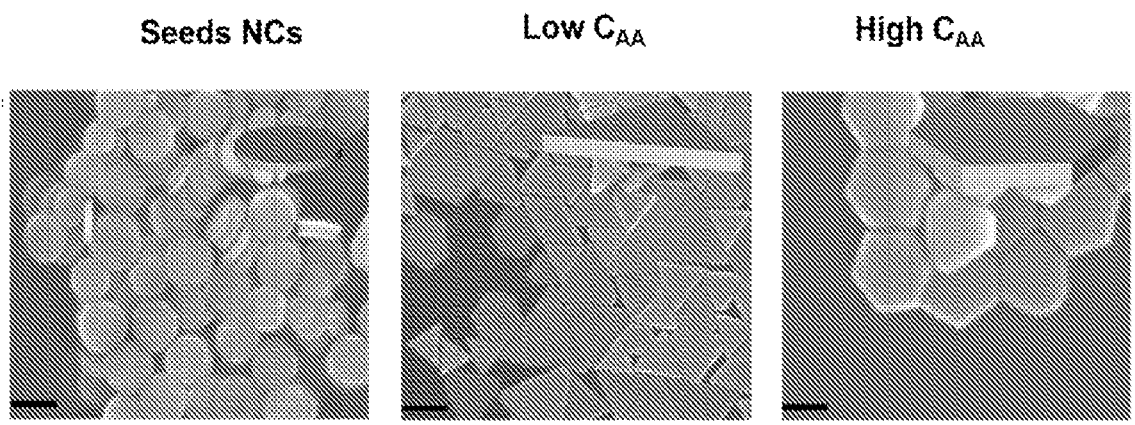
FIG. 12B is an SEM image of nanocrystals grown using nanodisks as seeds with increasing AA concentrations (Low $C_{AA}$: 0.2 mM AA in growth solution; High $C_{AA}$: 1 mM AA in growth solution). Scale bars: 100 nm.

Control: For the control experiments, nanoprisms and nanodisks without additional ligand functionalization were used as seeds for further growth with different supersaturation by changing AA concentrations. In particular, 60 µL nanoprisms or nanodisks without additional ligand functionalization on them were injected into 1.25 mL 10 mM CTAB solutions with 6.24 µL of 25 mM $HAuCl_4$ and increasing volumes of 100 mM AA (2 µL-10 µL). The solutions were kept at room temperature for 4 hours. Due to the lack of energy barriers of the seeds, the subsequent growth occurred at all of the positions on the seeds without any site-selectivity, resulting in larger triangular prisms or hexagonal prisms at different AA concentrations. FIGS. 12A and 12B show SEM images of the nanoprism or nanodisk as seeds, respectively, and the subsequent growth at low and high AA concentrations. The low concentration was 0.2 mM AA in the growth solution and the high concentration was 1 mM AA in the growth solution. Scale bars in the images are 100 nm.

Figures 11A, 11B, 11C:
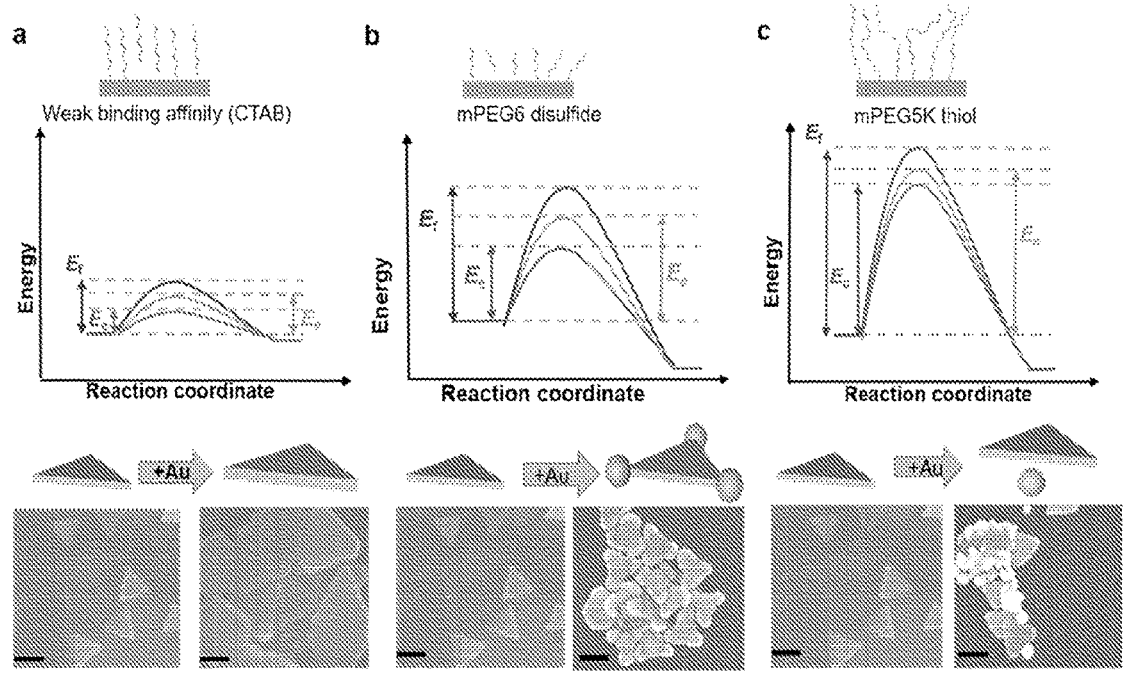
FIG. 11A is an energy barrier profile and SEM image of original nanoprisms and corresponding grown nanoprisms using unfunctionalized nanoprisms as seed. Scale bars: 100 nm.
FIG. 11B is an energy barrier profile and SEM image of original nanoprisms and corresponding grown nanoprisms using mPEG6 disulfide-functionalized nanoprisms as seed.
FIG. 11C is an energy barrier profile and SEM image of original nanoprisms and corresponding grown nanoprisms using mPEG5K thiol-functionalized nanoprisms as seed.

Referring to FIG. 12A, the unfunctionalized nanoprism seeds resulted in nanocrystals that grew uniformly, without any selectivity. This can be attributed to the weak binding affinity between CTAB and the gold nanocrystals compared with that of disulfide and thiol. The difference between the three energy barriers ($E_c$, $E_e$ and $E_f$) was almost zero (negligible). This demonstrated that CTAB does not play a significant role in influencing the selectivity (FIG. 12). Based on this result, CTAB was used only as a complexing agent to tune the supersaturation As shown in FIG. 110, growth was not observed on the mPEG5k thiol functionalized nanoprism seeds. It was observed that the gold atoms nucleated separately, as the energy barriers of these functionalized nanoprism seeds were even higher than the homogeneous nucleation energy barrier. Referring to FIG. 11, of the ligands tested, it was found the mPEG6 disulfide provided the optimal energy barrier profile for site-specific growth of nanocrystals.

Example 2: Corner/Edge Selective Growth

The functionalized nanocrystals described above were utilized as seeds for subsequent growth with different AA and CTAB concentrations. For corner- and edge-selective growth, 6.24 µL of 25 mM $HAuCl_4$ was added into 1.25 mL of 10 mM CTAB solution, then 100 mM AA (for corner-selective growth, 2-3 µL; for edge-selective growth, 10-11 µL depending on different shapes of seeds) was added. The solution was mixed by vortexing for 10 s. Next, 60 µL of seeds were injected, immediately followed by vortexing for 10 s. After allowing 4 hours for completion of nanocrystal growth, the reaction mixture was purified from excess reagents by centrifugation (5 min at 5,000-10,000 rpm depending on shapes of different seeds). The supernatant was removed, and the nanocrystals were resuspended in 1.0 mL of 1 mM CTAB by brief sonication (~10 s).

Figure 13:
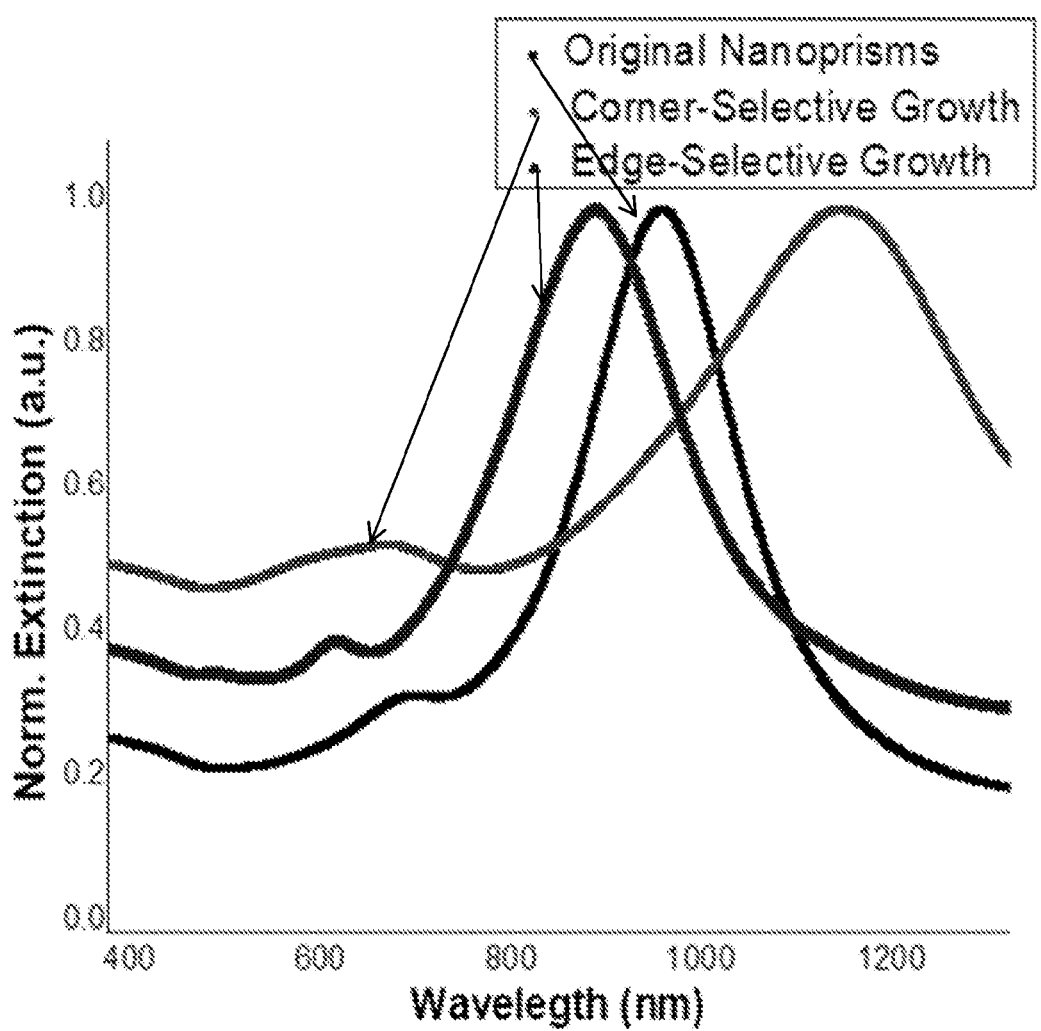
FIG. 13 is a UV-vis analysis of site-selectively grown gold nanoprisms.

The UV-vis spectra of seeds and nanocrystals after selective growth (FIG. 13) suggested that site-specifically grown nanocrystals have highly tunable and controllable plasmonic features.

Example 3: Facet-Selective Growth

For nanorods, 1.25 mL of 10 mM CTAB, 6.24 µL of 25 mM $HAuCl_4$, and 15 µL of 100 mM AA were mixed. Then, 60 µL of seeds was injected, and the solution was allowed to react for 4 hours. Moreover, for nanodisks, 1.25 mL of 10 mM CTAB, 6.24 µL of 25 mM $HAuCl_4$ and 2.5 µL of 100 mM AA were mixed. Then, 30 µL of seeds were injected, and the solution was allowed to react for 6 hours.

Example 4: Exposed-Facet Controlled Growth

The concentration of CTAB was adjusted to produce site-specifically grown nanocrystals with different types of exposed facets (with the other reaction conditions the same as in the case of the edge/corner-selective growth of nanocrystals of Example 2). Ten mM CTAB was used to synthesize grown nanocrystals bound by high-energy surfaces, while 100 mM CTAB was used for low-energy surfaces. The amount of deposition was increased by decreasing the amount of seeds from 60 µL to 6 µL.

Referring to FIG. 16, lower Δµ (at 100 mM CTAB) resulted in the formation of (FIG. 16B) selectively grown concave rhombic dodecahedra bound by {111} facets and (FIG. 16E) selectively grown nanodisks bound by convex-type surfaces, whereas a higher Δµ (at 10 mM CTAB) facilitated the selective growth of (FIG. 16C) concave rhombic dodecahedra with {111} and {100} facets exposed, as well as (FIG. 16F) nanodisks bound by concave and convex-type surfaces. The shape evolution from concave rhombic dodecahedra to octahedra or cuboctahedra, and the evolution from nanodisks to triangular or hexagonal nanoprisms were controlled by decreasing the amount of seeds.

Example 5: Corner- and Edge-Selective Grown Concave Rhombic Dodecahedra Nanocrystals Corner- and edge-selective grown concave rhombic dodecahedra were further confirmed by SAED patterns (FIG. 5) due to their complexity. The diffraction patterns in (a) and (b) were characteristic of the [21$\bar{1}$] and [111] orientations, respectively.

Example 6: Tuning the Size of Grown Nanocrystals

Figures 14A, 14B, 14C, 14D:
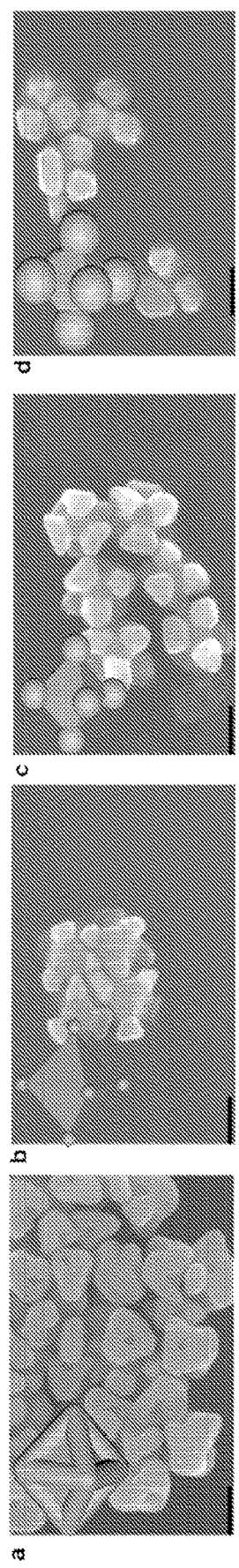
FIG. 14A-is an SEM image of octahedra with non-ideal selectivity when growth occurred all at once. Scale bars, 100 nm
FIG. 14B is an SEM image of octahedra growth while adding gold precursors two separately and successively, showing growth only occurred on the existing nuclei at corners, resulting in enhanced selectivity. Scale bars, 100 nm.
FIG. 14C is an SEM image of octahedra growth while adding gold precursors three separately and successively, showing growth only occurred on the existing nuclei at corners, resulting in enhanced selectivity. Scale bars, 100 nm.

Separation of Nanocrystal Nucleation and Growth: Octahedral nanocrystals were used as a model system to tune the sizes of the grown regions and the effect of the separation of nanocrystal nucleation and growth. Four batches of growth solutions were studied for direct comparison. For batch I, 6.24 μL of 25 mM $HAuCl_4$ was added into 1.25 mL of 10 mM CTAB solution, then 2 μL of 100 mM AA was added. The solution was mixed by vortexing for 10 s. Next, 60 μL of seeds was injected, immediately followed by vortexing for 10 s. For batch II, the only difference compared with batch I was that 2 μL of 25 mM $HAuCl_4$ was added. For batch III, the initial conditions were the same as for batch II, except that 2 μL of 25 mM $HAuCl_4$ were also added 1 hour later. For batch IV, with the same initial conditions as batch II, 2 μL of 25 mM $HAuCl_4$ were added 1 hour later, and 2.24 μL of 25 mM $HAuCl_4$ were added 2 hours later. After a 6 h reaction time, the four types of reaction mixtures were purified from excess reagents by centrifugation for 5 min at 5,000 rpm. The supernatant was removed, and the nanocrystals were resuspended in 1.0 mL of 1 mM CTAB by brief sonication (~10 s) for further characterization To tune their size, the nucleation and growth of the nanocrystals can be separated by multiple growth steps. For one-step growth, the large amount of deposition unavoidably resulted in large initial $\Delta\mu$, leading to deposition sites that were not ideal (FIG. 14A). However, when the same amount of deposition occurred in several steps, the subsequent growth preferentially occurred on the existing nuclei at specific sites, facilitating better and more flexible control over growth selectivity (FIGS. 14B-D).

Example 7: Tip-Selectively Grown Nanorods

Figure 15:
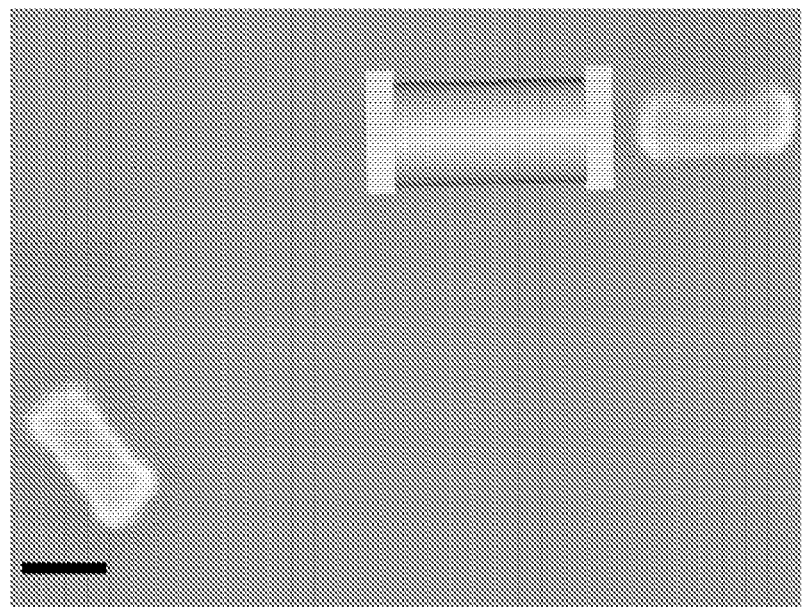
FIG. 15 is an SEM image of tip-selectively grown nanorods. Scale bar, 100 nm.
Figure 16A:
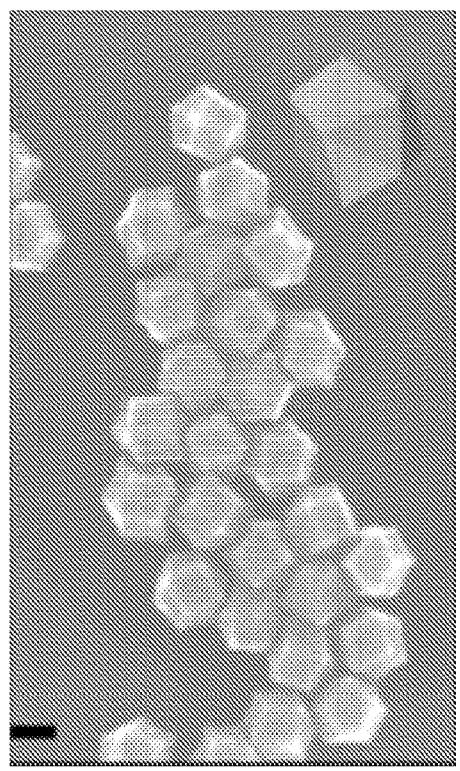
FIG. 16A is a SEM image of Au concave rhombic dodecahedra as seed nanocrystals. Scale bar: 100 nm.
Figure 16B:
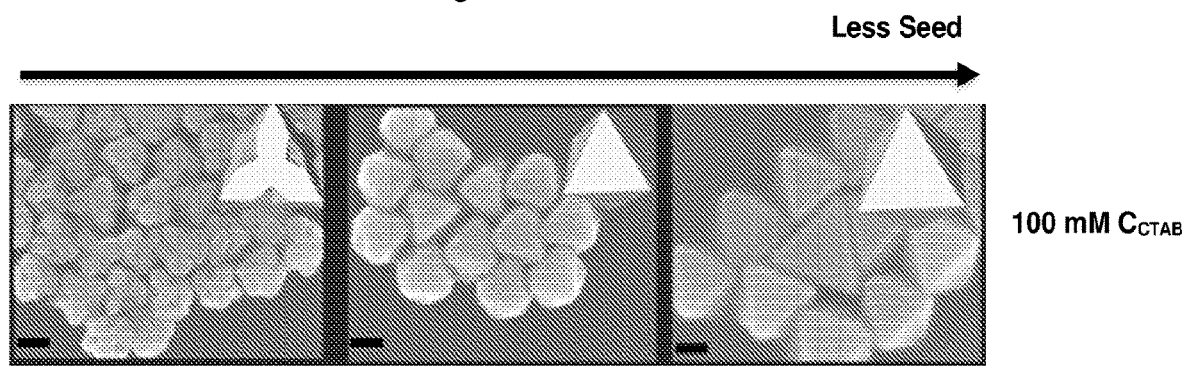
FIG. 16B is SEM images of grown nanocrystal bound by {111} facets (shown in the inset models). The images in each panel are arranged from left to right with a decreasing amount of seeds to show how growth evolves as more material is deposited on each seed. Scale bars: 100 nm
Figure 16C:
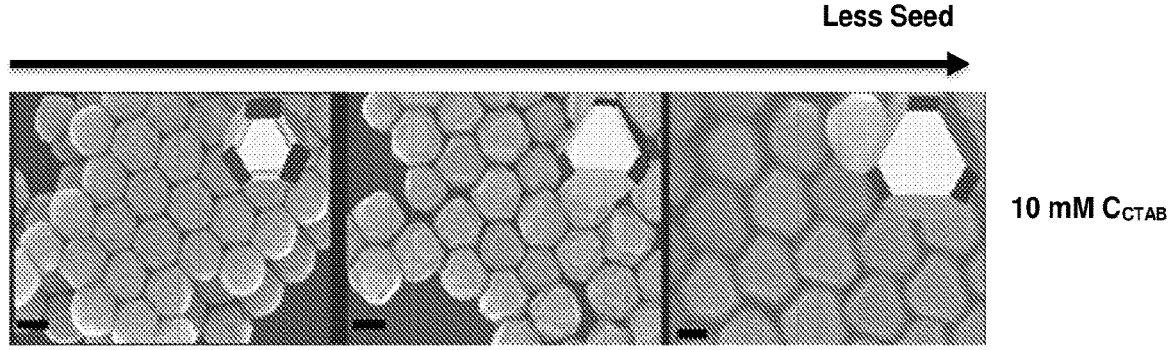
FIG. 16C is SEM image of grown nanocrystals bound by the {111} and {100} facets. The images in each panel are arranged from left to right with a decreasing amount of seeds to show how growth evolves as more material is deposited on each seed. Scale bars: 100 nm.
Figure 16D:
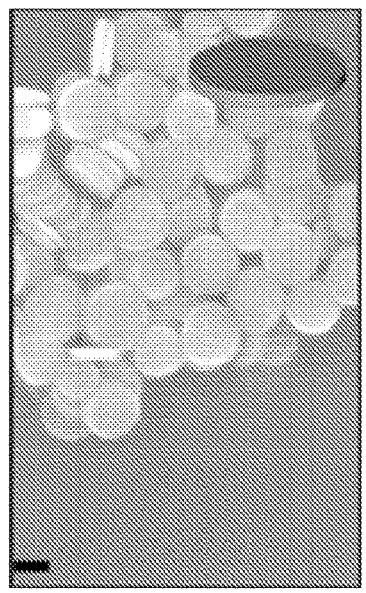
FIG. 16D is a SEM image of Au nanodisks as seed nanocrystals.
Figure 16E:
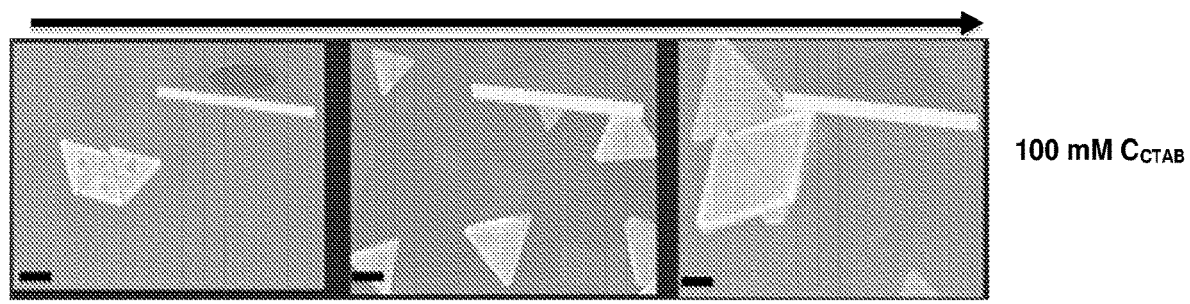
FIG. 16E is SEM images of grown nanocrystals bound by the convex-type surfaces. The images in each panel are arranged from left to right with a decreasing amount of seeds to show how growth evolves as more material is deposited on each seed. Scale bars: 100 nm.
Figure 16F:
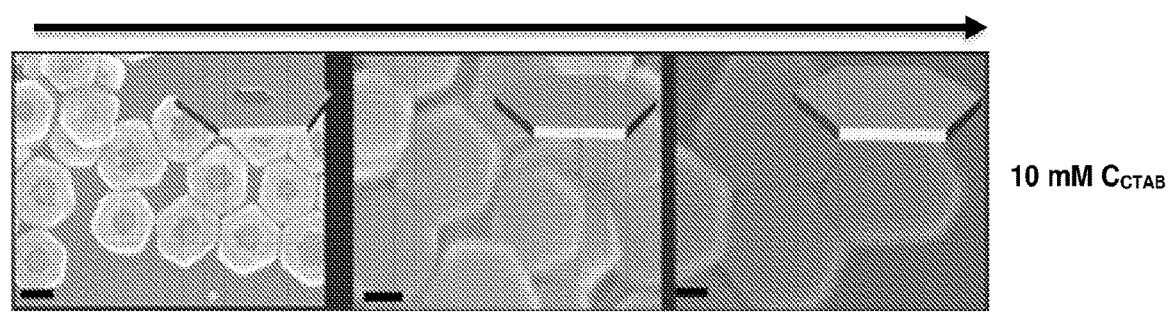
FIG. 16F is image of grown nanocrystals bound by the concave-type and convex-type surfaces. The images in each panel are arranged from left to right with a decreasing amount of seeds to show how growth evolves as more material is deposited on each seed. Scale bars: 100 nm.

The tips of nanorods have higher curvatures than the edges, such that $E_{tip} < E_{edge}$. When the $\Delta\mu$ of the growth solution was larger than $E_{tip}$, the tips of the nanorods were selectively deposited based on the curvature-selective design rule (FIG. 15). As is discussed in the main text, when further increasing $\Delta\mu$ ($\Delta\mu > E_{\{110\}}$, {110} facets along the edges were selectively deposited on according to the facet-selective design rule.

Example 8: Synthesis of Heterogeneous Nanocrystals

Synthesis of Au/Ag NCs: Sixty μL of seeds was added to 1.25 mL of 10 mM CTAB solution containing 15.6 μL of 10 mM $AgNO_3$. Afterwards, 1 M NaOH (for corner selective growth-7.5 μL; for edge selective growth-10 μL) was introduced. After thorough mixing, 75 μL of 100 mM AA was finally injected, immediately followed by 10 s of vortexing. The solution was kept at room temperature overnight.

Synthesis of Au/Pd NCs: 10 mM $H_2PdCl_4$ aqueous solution was prepared by completely dissolving 89 mg $PdCl_2$ in 50 mL of 20 mM HCl in a boiling water bath. 1.25 mL of 10 mM CTAB, 60 μL of seeds, and 15.6 μL of 10 mM $H_2PdCl_4$ were mixed. Then, 15 μL of 100 mM AA were injected, and the solution was allowed to react overnight.

REFERENCES

Lin, H. X. et al. Supersaturation-dependent surface structure evolution: From ionic, molecular to metallic micro/nanocrystals. *J. Am. Chem. Soc.* 135, 9311-9314 (2013).

Zeng, Q. & Xu, S. Thermodynamics and Characteristics of Heterogeneous Nucleation of Fractal Surfaces. *J. Phys. Chem. C* 119, 27426-27433 (2015).

1. Chen, C. et al. Highly crystalline multimetallic nanoframes with three-dimensional electrocatalytic surfaces. *Science.* 343, 1339-1343 (2014).
2. Fu, Q. et al. Interface-confined ferrous centers for catalytic oxidation. *Science.* 328, 1141-1144 (2010).
3. Hill, J. C., Landers, A. T. & Switzer, J. A. An electrodeposited inhomogeneous metal-insulator-semiconductor junction for efficient photoelectrochemical water oxidation. *Nat. Mater.* 14, 1150-1155 (2015).
4. Demortiére, A. et al. In Situ Optical and Structural Studies on Photoluminesence Quenching in CdSe/CdS/Au Heterostructures. *J. Am. Chem. Soc.* 136, 2342-2350 (2014).
5. Cortie, M. B. & McDonagh, A. M. Synthesis and Optical Properties of Hybrid and Alloy Plasmonic Nanoparticles. *Chem. Rev.* 111, 3713-3735 (2011).
6. Xu, C., Wang, B. & Sun, S. Dumbbell-like Au—$Fe_3O_4$ Nanoparticles for Target-Specific Platin Delivery. *J. Am. Chem. Soc.* 131, 4216-4217 (2009).
7. Schick, I. et al. Multifunctional Two-Photon Active Silica-Coated Au@MnO Janus Particles for Selective Dual Functionalization and Imaging. *J. Am. Chem. Soc.* 136, 2473-2483 (2014).
8. Cortie, M. B. & McDonagh, A. M. Synthesis and optical properties of hybrid and alloy plasmonic nanoparticles. *Chem. Rev.* 111, 3713-3735 (2011).
9. Lai, W. H. et al. Morphology tuning of inorganic nanomaterials grown by precipitation through control of electrolytic dissociation and supersaturation. *Nat. Chem.* 11, 695-701 (2019).
10. Gilroy, K. D., Ruditskiy, A., Peng, H. C., Qin, D. & Xia, Y. Bimetallic nanocrystals: Syntheses, properties, and applications. *Chem. Rev.* 116, 10414-10472 (2016).
11. Xia, Y., Xiong, Y., Lim, B. & Skrabalak, S. E. Shape-controlled synthesis of metal nanocrystals: Simple chemistry meets complex physics? *Angew. Chemie* Int. Ed. 48, 60-103 (2009).
12. Burda, C., Chen, X., Narayanan, R. & El-Sayed, M. A. Chemistry and properties of nanocrystals of different shapes. *Chem. Rev.* 105, 1025-1102 (2005).
13. Chiu, C. Y. et al. Platinum nanocrystals selectively shaped using facet-specific peptide sequences. *Nat. Chem.* 3, 393-399 (2011).
14. Xiong, Y. & Xia, Y. Shape-Controlled Synthesis of Metal Nanostructures: The Case of Palladium. *Adv. Mater.* 19, 3385-3391 (2007).
15. Chen, M., Wu, B., Yang, J. & Zheng, N. Small Adsorbate-Assisted Shape Control of Pd and Pt Nanocrystals. *Adv. Mater.* 24, 862-879 (2012).
16. O'Brien, M. N., Jones, M. R., Brown, K. A. & Mirkin, C. A. Universal noble metal nanoparticle seeds realized through iterative reductive growth and oxidative dissolution reactions. *J. Am. Chem. Soc.* 136, 7603-7606 (2014).
17. Zhang, J., Langille, M. R. & Mirkin, C. A. Photomediated synthesis of silver triangular bipyramids and prisms: The effect of pH and BSPP. *J. Am. Chem. Soc.* 132, 12502-12510 (2010).
18. Jin, R. et al. Photoinduced conversion of silver nanospheres to nanoprisms. *Science.* 294, 1901-1903 (2001).
19. Langille, M. R., Personick, M. L., Zhang, J. & Mirkin, C. A. Defining rules for the shape evolution of gold nanoparticles. *J. Am. Chem. Soc.* 134, 14542-14554 (2012).

20. Personick, M. L. et al. Synthesis and isolation of {110}-faceted gold bipyramids and rhombic dodecahedra. *J. Am. Chem. Soc.* 133, 6170-6173 (2011).
21. Personick, M. L., Langille, M. R., Zhang, J. & Mirkin, C. A. Shape control of gold nanoparticles by silver underpotential deposition. *Nano Lett.* 11, 3394-3398 (2011).
22. Zhang, J. et al. Concave cubic gold nanocrystals with high-index facets. *J. Am. Chem. Soc.* 132, 14012-14014 (2010).
23. Laramy, C. R. et al. Controlled Symmetry Breaking in Colloidal Crystal Engineering with DNA. *ACS Nano* 13, 1412-1420 (2019).
24. Tsao, Y. C., Rej, S., Chiu, C. Y. & Huang, M. H. Aqueous phase synthesis of Au—Ag core-shell nanocrystals with tunable shapes and their optical and catalytic properties. *J. Am. Chem. Soc.* 136, 396-404 (2014).
25. Wang, F., Cheng, S., Bao, Z. & Wang, J. Anisotropic Overgrowth of Metal Heterostructures Induced by a Site-Selective Silica Coating. *Angew. Chemie Int. Ed.* 52, 10344-10348 (2013).
26. Ham, S., Jang, H.-J., Song, Y., Shuford, K. L. & Park, S. Octahedral and Cubic Gold Nanoframes with Platinum Framework. *Angew. Chemie Int. Ed.* 54, 9025-9028 (2015).
27. Yu, Y., Zhang, Q., Xie, J. & Lee, J. Y. Engineering the architectural diversity of heterogeneous metallic nanocrystals. *Nat. Commun.* 4, 1-8 (2013).
28. Walker, D. A., Leitsch, E. K., Nap, R. J., Szleifer, I. & Grzybowski, B. A. Geometric curvature controls the chemical patchiness and self-assembly of nanoparticles. *Nat. Nanotechnol.* 8, 676-681 (2013).
29. Wu, M. et al. Solution NMR Analysis of Ligand Environment in Quaternary Ammonium-Terminated Self-Assembled Monolayers on Gold Nanoparticles: The Effect of Surface Curvature and Ligand Structure. *J. Am. Chem. Soc.* 141, 4316-4327 (2019).
30. Wang, Z., Yang, G., Zhang, Z., Jin, M. & Yin, Y. Selectivity on Etching: Creation of High-Energy Facets on Copper Nanocrystals for CO2 Electrochemical Reduction. *ACS Nano* 10, 4559-4564 (2016).
31. Janicek, B. E. et al. Quantitative Imaging of Organic Ligand Density on Anisotropic Inorganic Nanocrystals. *Nano Lett.* 19, 6308-6314 (2019).
32. Kim, J. Y. et al. Dipole-like electrostatic asymmetry of gold nanorods. *Sci. Adv.* 4, e1700682 (2018).
33. Millstone, J. E., Hurst, S. J., Métraux, G. S., Cutler, J. I. & Mirkin, C. A. Colloidal Gold and Silver Triangular Nanoprisms. *Small* 5, 646-664 (2009).
34. Lin, H. et al. Supersaturation-Dependent Surface Structure Evolution: From Ionic, Molecular to Metallic Micro/Nanocrystals. *J. Am. Chem. Soc.* 135, 9311-9314 (2013).
35. Millstone, J. E., Wei, W., Jones, M. R., Yoo, H. & Mirkin, C. A. Iodide Ions Control Seed-Mediated Growth of Anisotropic Gold Nanoparticles. *Nano Lett.* 8, 2526-2529 (2008).
36. Young, K. L. et al. Assembly of reconfigurable one-dimensional colloidal superlattices due to a synergy of fundamental nanoscale forces. *Proc. Natl. Acad. Sci.* 109, 2240-2245 (2012).
37. Rodríguez-Fernández, J., Pérez-Juste, J., Mulvaney, P. & Liz-Marzán, L. M. Spatially-Directed Oxidation of Gold Nanoparticles by Au(III)—CTAB Complexes. *J. Phys. Chem. B* 109, 14257-14261 (2005).
38. O'Brien, M. N., Jones, M. R., Kohlstedt, K. L., Schatz, G. C. & Mirkin, C. A. Uniform Circular Disks With Synthetically Tailorable Diameters: Two-Dimensional Nanoparticles for Plasmonics. *Nano Lett.* 15, 1012-1017 (2015).
39. Ye, X., Zheng, C., Chen, J., Gao, Y. & Murray, C. B. Using Binary Surfactant Mixtures To Simultaneously Improve the Dimensional Tunability and Monodispersity in the Seeded Growth of Gold Nanorods. *Nano Lett.* 13, 765-771 (2013).
40. Sanchez-Iglesias, A. et al. High-Yield Seeded Growth of Monodisperse Pentatwinned Gold Nanoparticles through Thermally Induced Seed Twinning. *J. Am. Chem. Soc.* 139, 107-110 (2017).

What is claimed:

1. A method of site-selective growth of nanocrystals on an anisotropic seed;
   functionalizing the anisotropic seed with a ligand, wherein the anisotropic seed has at least two regions, wherein the at least two regions have different curvatures and/or are facets of different crystallographic planes, the ligand attaches to the anisotropic seed in the at least two regions, thereby resulting in a functionalized seed having at least two different energy barriers for subsequent growth at the at least two regions;
   selecting at least one of the at least two regions for site-selective growth, wherein the at least one selected region has a selected region energy barrier;
   admixing a nanocrystal precursor, a complexing agent, and a reducing agent to form a growth solution, wherein an amount of the reducing agent and/or an amount of the complexing agent is selected to define a supersaturation of the growth solution that is sufficient for overcoming the at least one selected region energy barrier; and
   immersing the functionalized seed in the growth solution under conditions for site-selectively growth the nanocrystal at the at least one selected region.

2. The method of claim 1, wherein the at least two regions are regions having different curvatures and comprise a corner region, an edge region, and a face region, the curvature of the corner region is greater than the curvature of the edge region, which is greater than the curvature of the face region, thereby resulting in a functionalized seed having an energy barrier at the face region that is higher than an energy barrier at the edge region, and the energy barrier of the edge region is higher than an energy barrier at the corner region.

3. The method of claim 2, wherein the at least one selected region is the corner region, and the amount of the reducing agent and/or the amount of the complexing agent is selected to define a supersaturation of the growth solution that is sufficient for overcoming the energy barrier at the corner region, but not sufficient for overcoming the energy barrier at the edge region.

4. The method of claim 1, wherein the at least two regions are facets of different crystallographic planes and comprises at least one facet in the {100} crystallographic plane and at least one facet in the {110} crystallographic plane, wherein the {110} crystallographic plane has a higher surface energy than a surface energy of the {100} crystallographic plane, thereby resulting in a functionalized seed having an energy barrier at the at least one facet in the {110} crystallographic plane that is lower than an energy barrier at the at least one facet in the {100} crystallographic plane, and
   the at least one selected region is the at least one fact in the {110} crystallographic plane, and the amount of the reducing agent and/or the amount of the complexing agent is selected to define a supersaturation of the growth solution that is sufficient for overcoming the energy barrier in the at least one facet in the {110} crystallographic plane, but not sufficient for overcoming the energy barrier at the at least one facet in the {100} crystallographic plane.

5. A method of multi-step site-selective growth of nanocrystals on an anisotropic seed;
functionalizing the anisotropic seed with a ligand, wherein the anisotropic seed has at least two regions having different curvatures, the ligand attaches to the anisotropic seed in the at least two regions, thereby resulting in a functionalized seed having at least two different energy barriers for subsequent growth at the at least two regions;
selecting one of the at least two regions for site-selective growth, wherein the selected region has a selected region energy barrier;
immersing the functionalized seed in a growth solution under conditions to selectively form nuclei at the selected region of curvature to thereby form a selected curvature-nucleated seed, wherein the first growth solution comprises a nanocrystal precursor, a complexing agent, and a reducing agent, and an amount of the reducing agent and/or an amount of the complexing agent is selected to define a supersaturation of the first growth solution that is sufficient for overcoming the selected region energy barrier; and
adding nanocrystal precursor to the growth solution while the selected-curvature-nucleated is immersed in the growth solution to grow nanocrystals at the nuclei.

6. The method of claim 5, wherein the at least two regions are regions that have different curvatures and comprise a corner region, an edge region, and a face region, the curvature of the corner region is greater than the curvature of the edge region, which is greater than the curvature of the face region, thereby resulting in a functionalized seed having an energy barrier at the face region that is higher than an energy barrier at the edge region and the energy barrier at the edge region is higher than an energy barrier at the corner region.

7. The method of claim 6, wherein the at least one first selected region is the corner region, and the amount of the reducing agent and/or the amount of the complexing agent is selected to define a supersaturation of the first growth solution that is sufficient for overcoming the energy barrier at the corner region, but not sufficient for overcoming the energy barrier at the edge region.

8. The method of claim 5, wherein the at least one second selected region is an edge region, and the amount of reducing agent and/or amount of complexing agent is selected to define a supersaturation of the second growth solution that is sufficient for overcoming the energy barrier at the edge region, but not sufficient for overcoming the energy barrier at the face region.

9. The method of claim 5, wherein the at least one second selected region is the corner region, and the amount of the reducing agent and/or the amount of the complexing agent is selected to define a supersaturation of the second growth solution that is sufficient for overcoming the energy barrier at the corner region, but not sufficient for overcoming the energy barrier at the edge region.

10. A multi-step method of corner-selective growth of nanocrystals on an anisotropic seed;
functionalizing the anisotropic seed with a ligand, wherein the anisotropic seed has at least a corner region and an edge region, the ligand attaches to the anisotropic seed in at least the corner region and the edge region, thereby resulting in a functionalized seed having corner energy barrier and an edge energy barrier, wherein the edge energy barrier is greater than the corner energy barrier;
immersing the functionalized seed in a first growth solution under conditions to selectively form nuclei at the corner region to thereby form a corner-nucleated seed, wherein the first growth solution comprises a nanocrystal precursor, a complexing agent, and a reducing agent, and an amount of the reducing agent and/or an amount of the complexing agent is selected to define a supersaturation of the first growth solution that is sufficient to overcome the corner energy barrier but not the edge energy barrier;
immersing the corner-nucleated seed in a second growth solution under conditions to selectively grow the nanocrystals at the nuclei, wherein the second growth solution comprises a nanocrystal precursor, a complexing agent, and a reducing agent, and an amount of the reducing agent and/or an amount of the complexing agent is selected to define a supersaturation of the second growth solution that is sufficient to overcome the corner energy barrier but not the edge energy barrier, wherein:
the supersaturation of the second growth solution is different from the supersaturation of the first growth solution;
when the supersaturation of the second growth solution is greater than the supersaturation of the first growth solution, nanocrystals grow at the nuclei having high energy facets as exposed facets, and
when the supersaturation of the second growth solution is less than the supersaturation of the first growth solution, nanocrystals grow at the nuclei having low energy facets as exposed facets.

11. A multi-step method of edge-selective growth of nanocrystals on an anisotropic seed;
functionalizing the anisotropic seed with a ligand, wherein the anisotropic seed has at least a corner region, an edge region, and a facet region, the ligand attaches to the anisotropic seed in at least the corner region, the edge region, and the facet region, thereby resulting in a functionalized seed having corner energy barrier, an edge energy barrier, and a facet energy barrier, wherein the facet energy barrier is greater than the edge energy barrier, and the edge energy barrier is greater than the corner energy barrier;
immersing the functionalized seed in a first growth solution under conditions to selectively form nuclei at the edge region to thereby form an edge-nucleated seed, wherein the first growth solution comprises a nanocrystal precursor, a complexing agent, and a reducing agent, and an amount of the reducing agent and/or an amount of the complexing agent is selected to define a supersaturation of the first growth solution that is sufficient to overcome the edge energy barrier but not the facet energy barrier;
immersing the edge-nucleated seed in a second growth solution under conditions to selectively grow the nanocrystals at the nuclei, wherein the second growth solution comprises a nanocrystal precursor, a complexing agent, and a reducing agent, and an amount of the reducing agent and/or an amount of the complexing agent is selected to define a supersaturation of the second growth solution that is sufficient to overcome the edge energy barrier but not the facet energy barrier, wherein:

the supersaturation of the second growth solution is different from the supersaturation of the first growth solution;

when the supersaturation of the second growth solution is greater than the supersaturation of the first growth solution, nanocrystals grow at the nuclei having high energy facets as exposed facets, and when the supersaturation of the second growth solution is less than the supersaturation of the first growth solution, nanocrystals grow at the nuclei having low energy facets as exposed facets.

12. The method of claim 1, wherein the ligand is a PEG selected from PEG4 to PEG1000 or the ligand is a PEG disulfide.

13. The method of claim 12, wherein the PEG disulfide is mPEG disulfide, PEG acid disulfide, or PEG NHS ester disulfide.

14. The method of claim 1, wherein the anisotropic seed has the shape of a disk, rod, prism, cube, concave rhombic dodecahedron, or octahedron.

15. The method of claim 1, wherein the reducing agent is one or more of ascorbic acid, hydroxylamine hydrochloride, hydrazine hydrate.

16. The method of claim 1, wherein the complexing agent is CTAB.

17. The method of claim 1, wherein the nanocrystals are a homogenous material or wherein the nanocrystals are a heterogenous material.

18. The method of claim 1, wherein the nanocrystal precursor is a precursor for depositing one or more of Au, Ag, Pd, Pt, Ti, Cu, alloys thereof, oxides thereof, and any combinations thereof.

19. The method of claim 18, wherein the nanocrystal precursor comprises $HAuCl_4$, $AgNO_3$, $H_2PdCl_4$, $H_2PtCl_6$, $CuCl_2$, $Cu_2(OAc)_4$, and combinations thereof.

20. The method of claim 1, wherein the anisotropic seeds are gold, $Fe_3O_4$, Ag, or quantum dots.

* * * * *